United States Patent
Park et al.

(10) Patent No.: US 6,509,611 B1
(45) Date of Patent: Jan. 21, 2003

(54) METHOD FOR WRAPPED-GATE MOSFET

(75) Inventors: Byeongju Park, Wappingers Falls, NY (US); Toshiharu Furukawa, Essex Junction, VT (US); Jack A. Mandelman, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/961,010

(22) Filed: Sep. 21, 2001

(51) Int. Cl.$^7$ .................. H01L 29/94; H01L 31/113
(52) U.S. Cl. ............... 257/330; 257/327; 257/332; 257/344; 257/347
(58) Field of Search .................... 257/330, 327, 257/332, 344, 347

(56) References Cited

U.S. PATENT DOCUMENTS

| | | | | |
|---|---|---|---|---|
| 5,414,287 A | * | 5/1995 | Hong | 257/316 |
| 5,780,327 A | * | 7/1998 | Chu et al. | 438/156 |
| 5,793,082 A | * | 8/1998 | Bryant | 257/330 |
| 6,242,775 B1 | * | 6/2001 | Noble | 257/330 |
| 6,355,532 B1 | * | 3/2002 | Seliskar et al. | 438/283 |

* cited by examiner

Primary Examiner—David Nelms
Assistant Examiner—Tu-Tu Ho
(74) Attorney, Agent, or Firm—Ira D. Blecker; McGuire Woods

(57) ABSTRACT

A wrapped-gate transistor includes a substrate having an upper surface and first and second side surfaces opposing to each other. Source and drain regions are formed in the substrate with a channel region therebetween. The channel region extends from the first side surface to the second side surfaces of the substrate. A gate dielectric layer is formed on the substrate. A gate electrode is formed on the gate dielectric layer to cover the channel region from the upper surface and the first and second side surfaces with the gate dielectric therebetween. The substrate is a silicon island formed on an insulation layer of an SOI (silicon-on-insulator) substrate or on a conventional non-SOI substrate, and has four side surfaces including the first and second side surfaces. The source and drain regions are formed on the portions of the substrate adjoining the third and fourth side surfaces which are perpendicular to the first and second side surfaces. The wrapped-gate structure provides a better and quicker potential control within the channel area, which yields steep sub-threshold slope and low sensitivity to the "body-to-source" voltage.

20 Claims, 18 Drawing Sheets

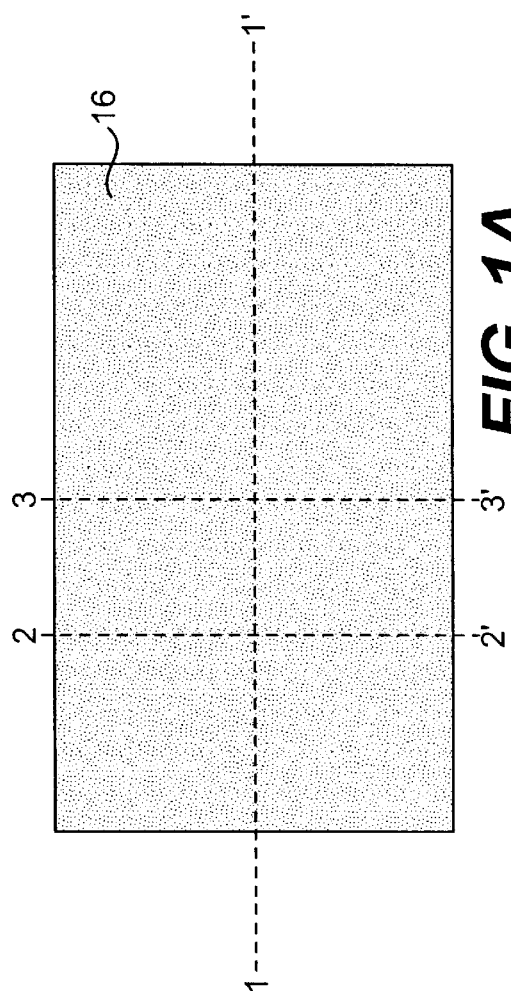
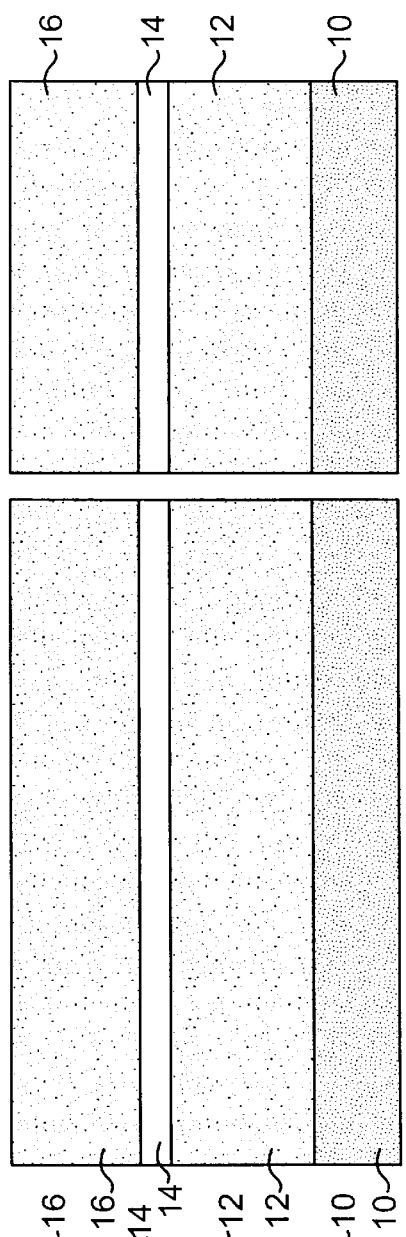

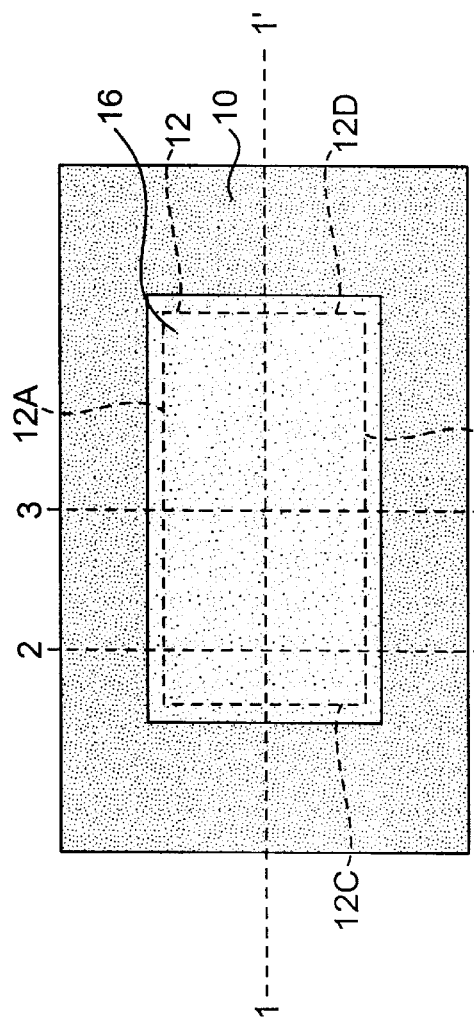
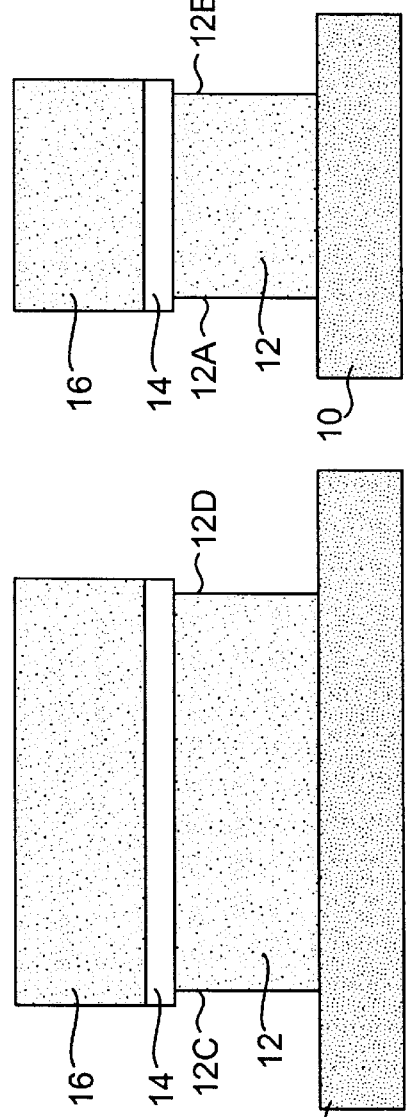
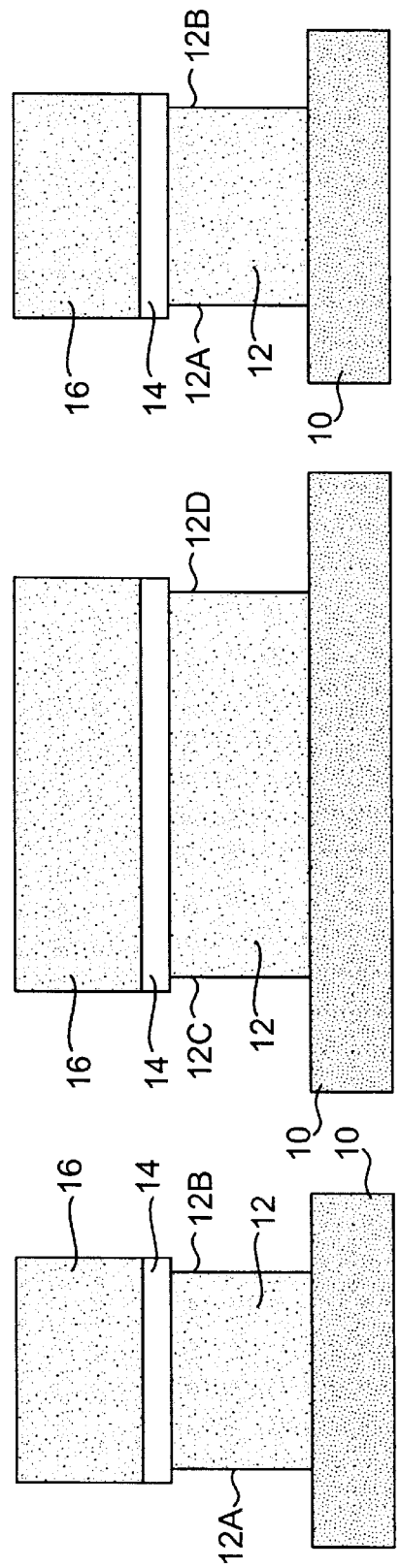

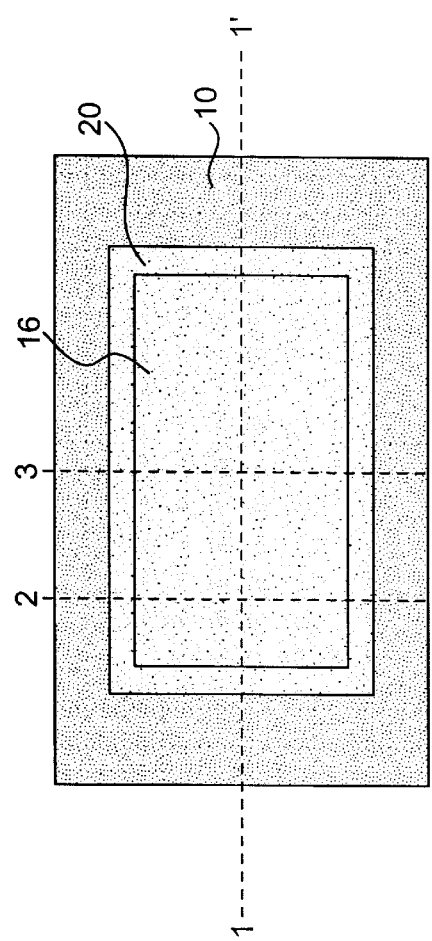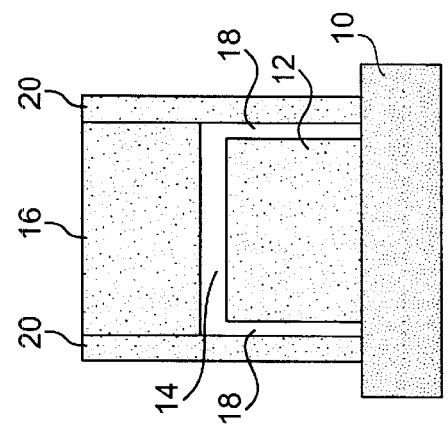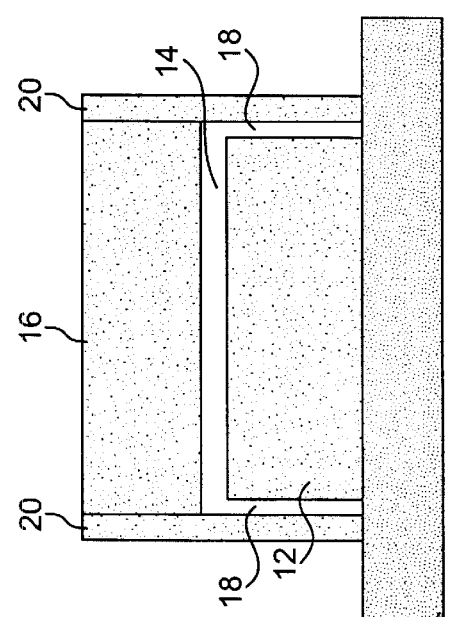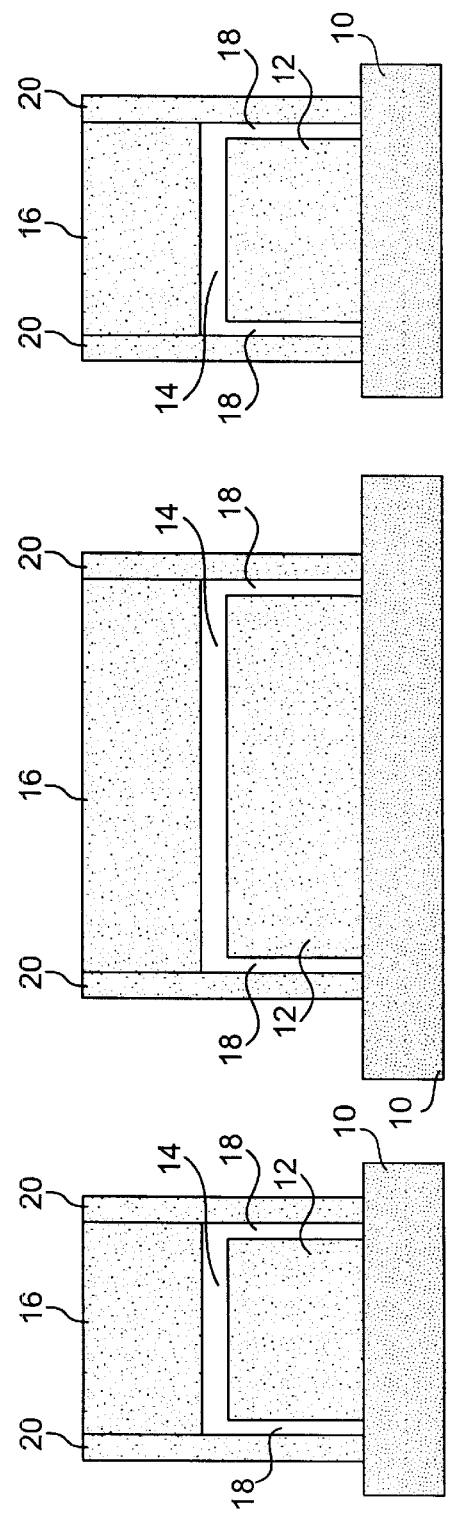

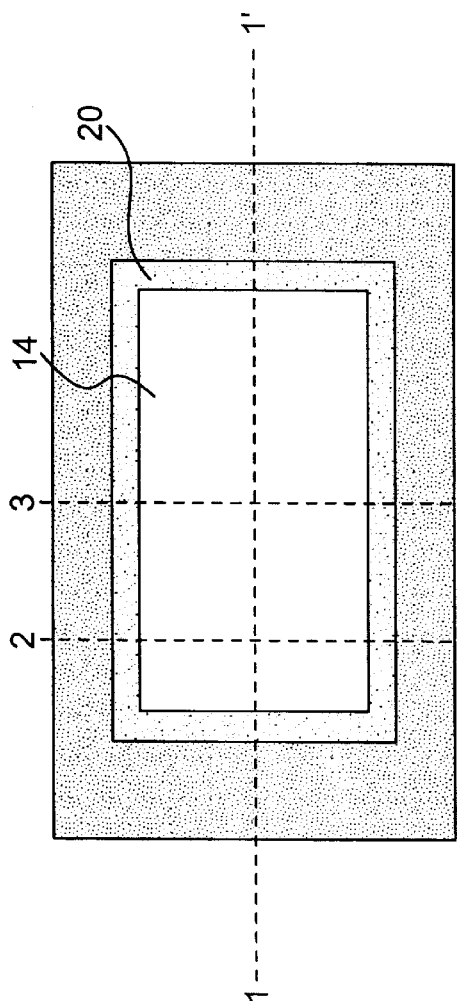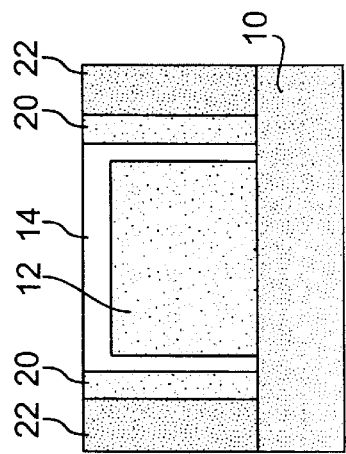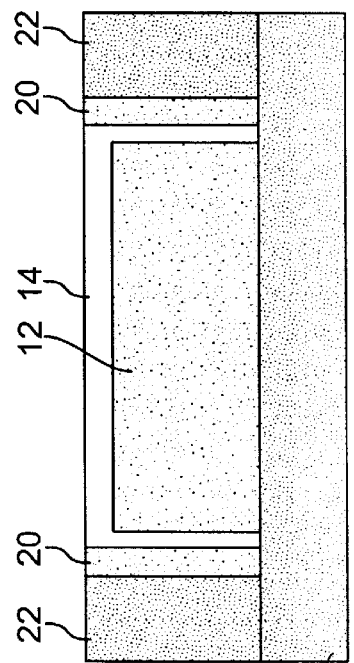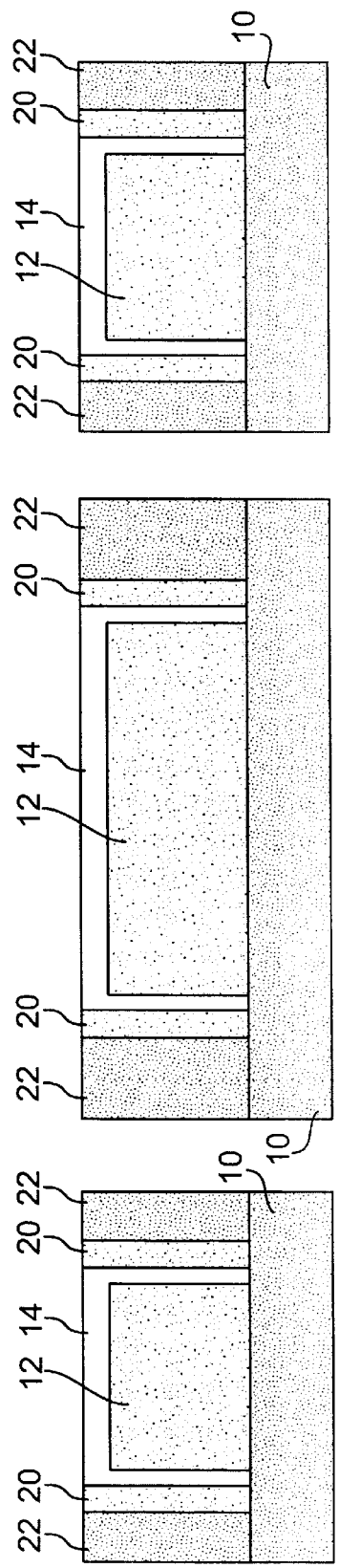

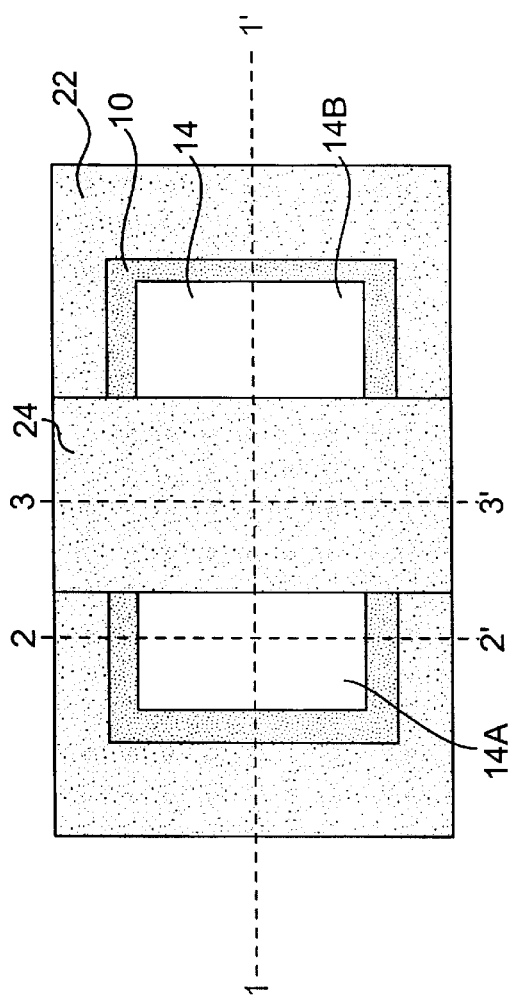
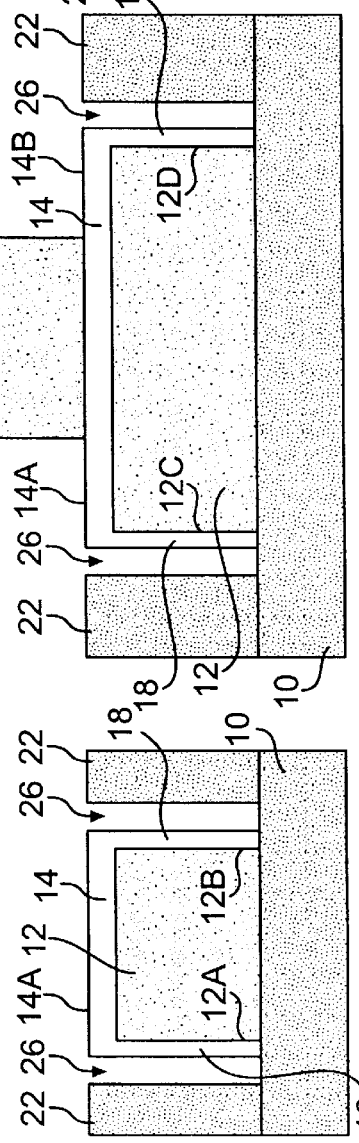
FIG. 7A
FIG. 7B
FIG. 7C
FIG. 7D

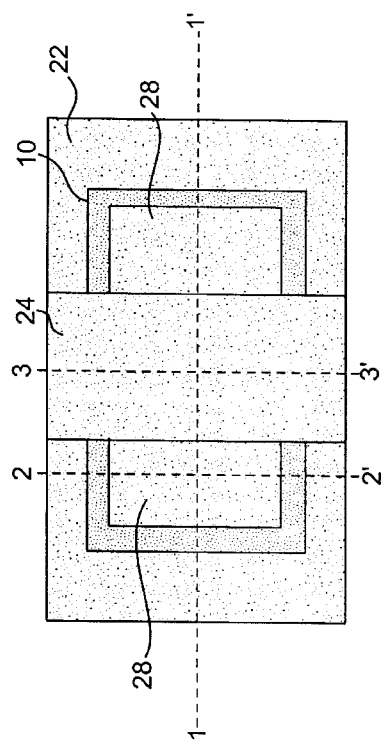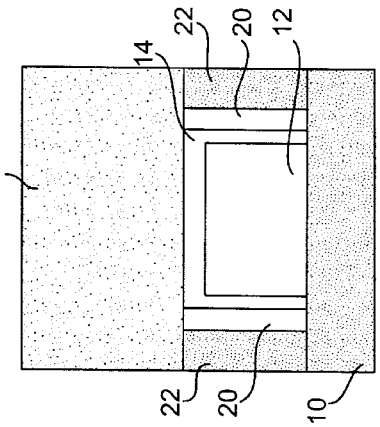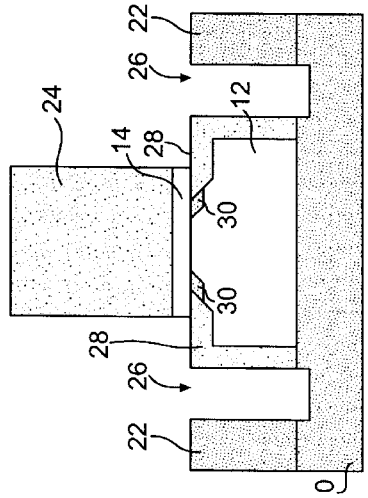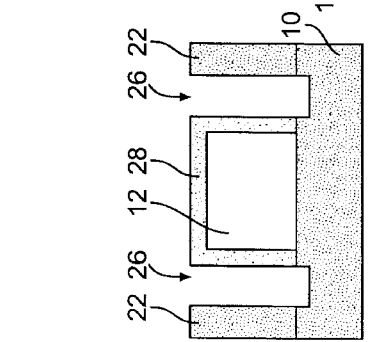
FIG. 10A
FIG. 10B
FIG. 10C
FIG. 10D

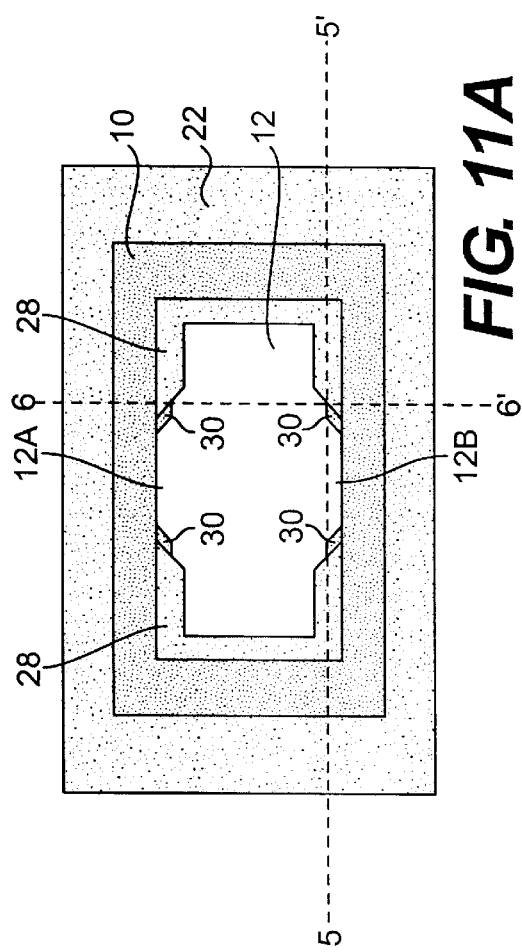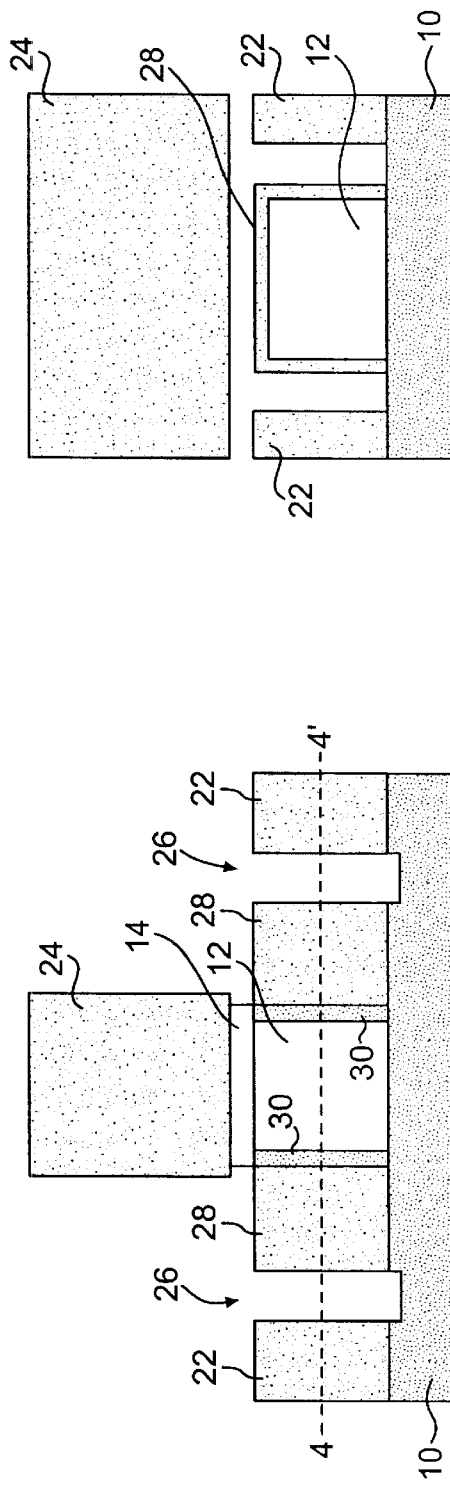

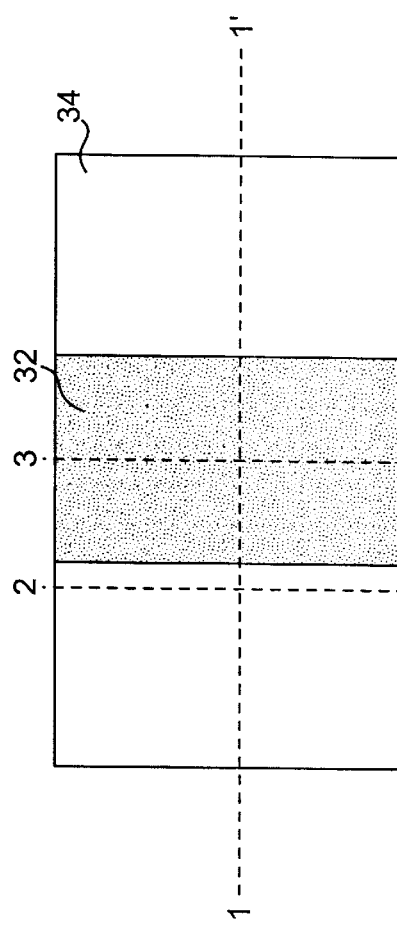
*FIG. 12A*
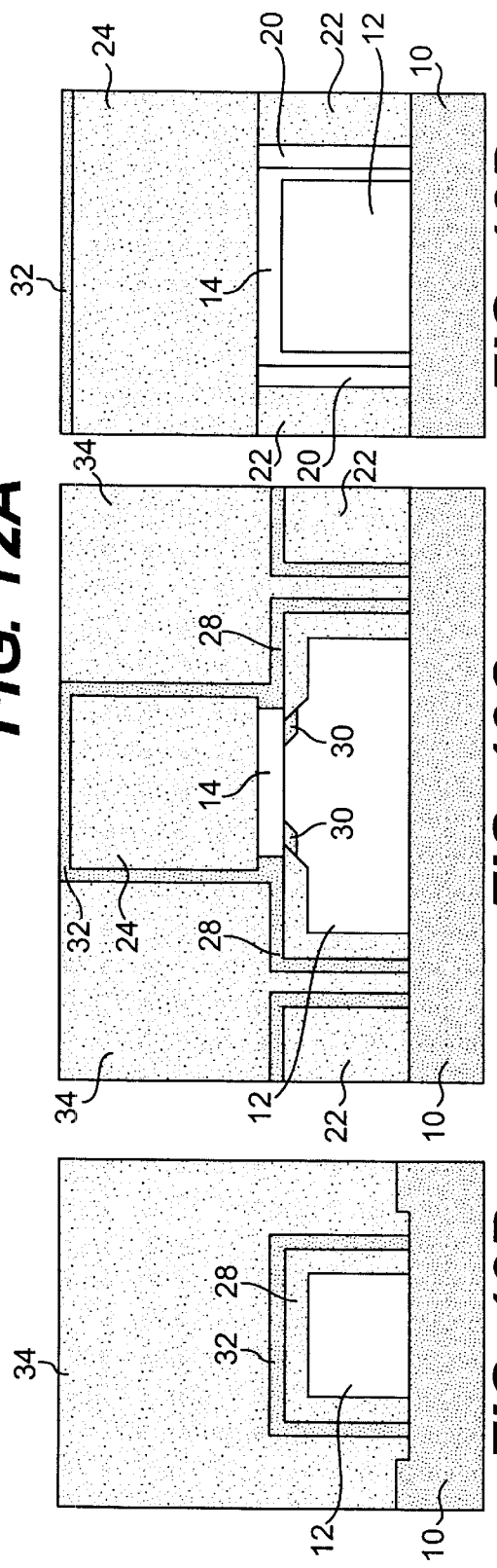
*FIG. 12D*
*FIG. 12C*
*FIG. 12B*

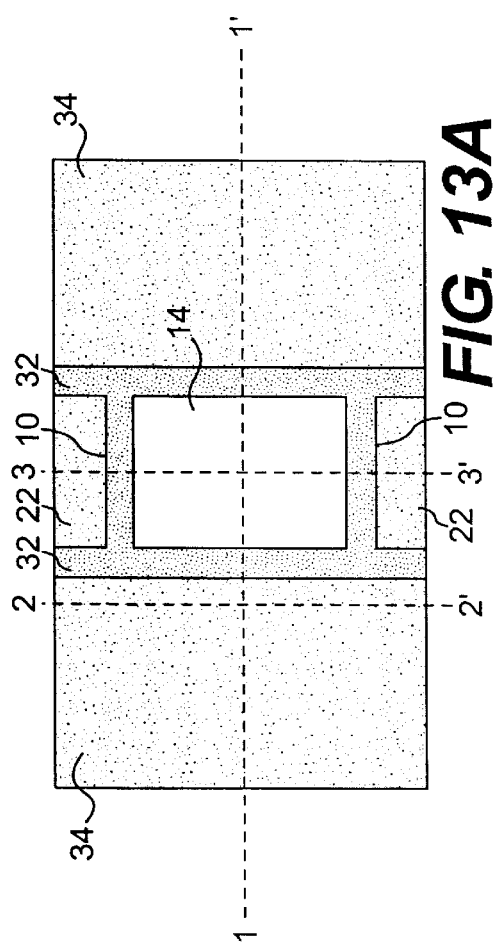
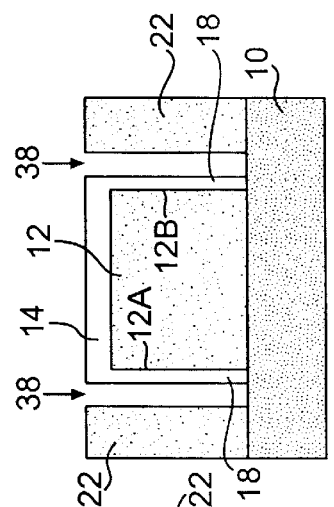
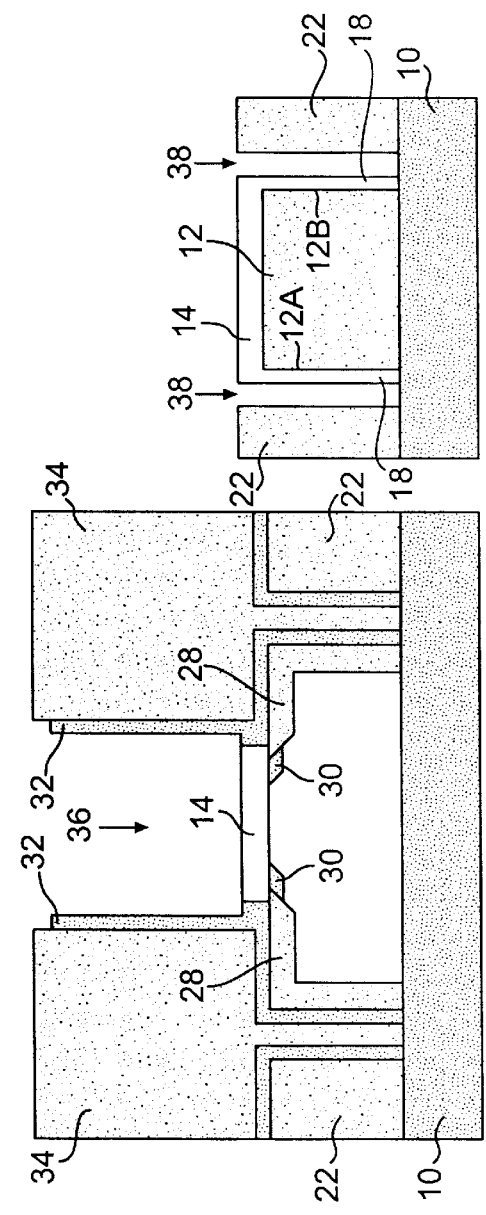
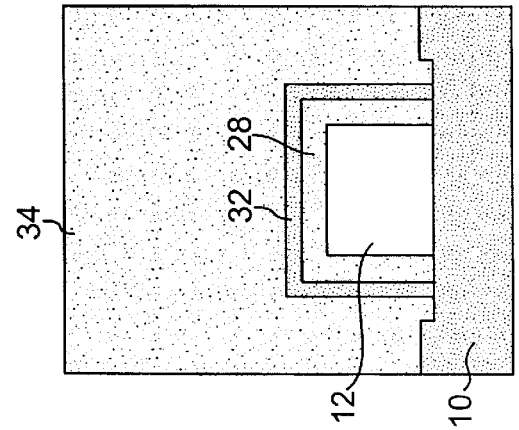

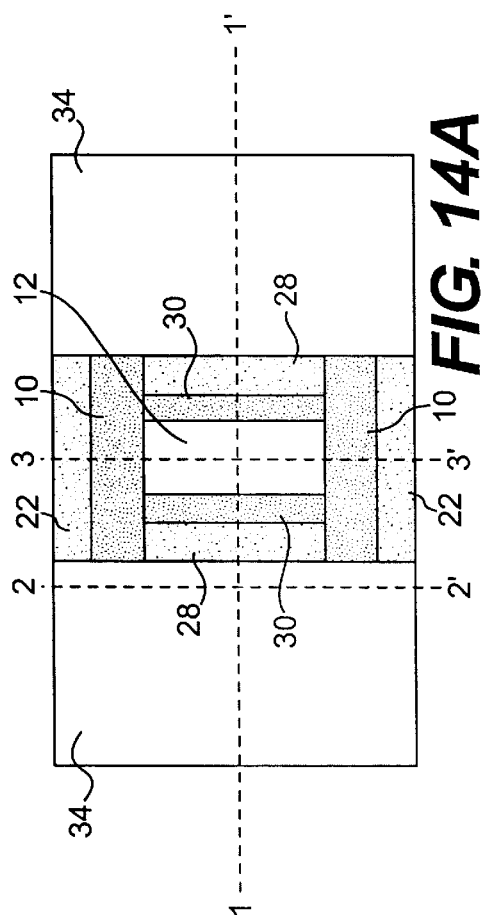
FIG. 14A
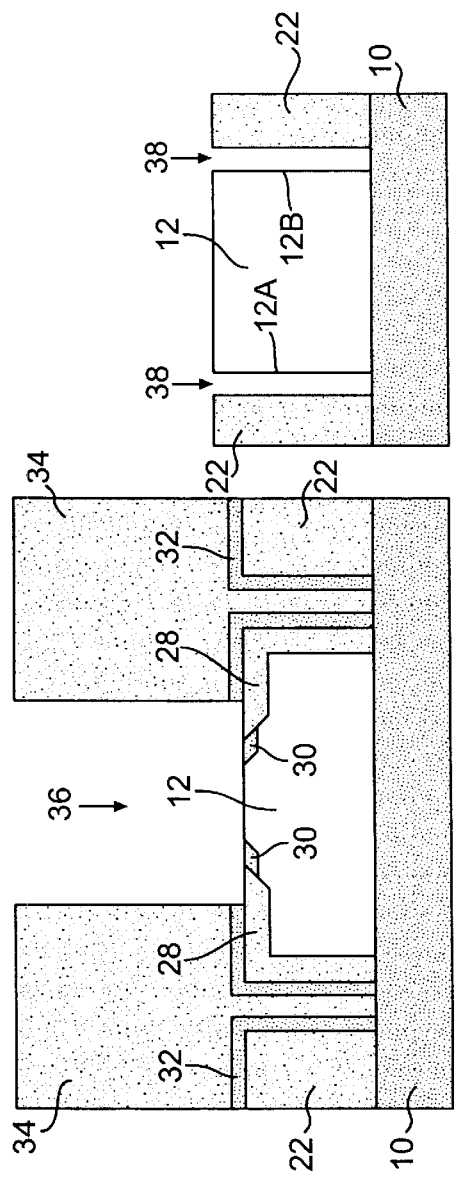
FIG. 14C
FIG. 14D
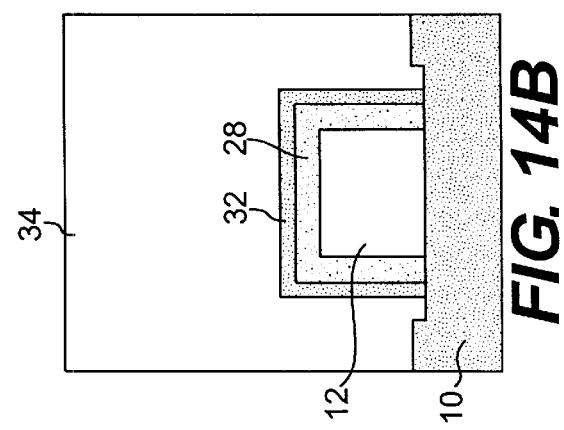
FIG. 14B

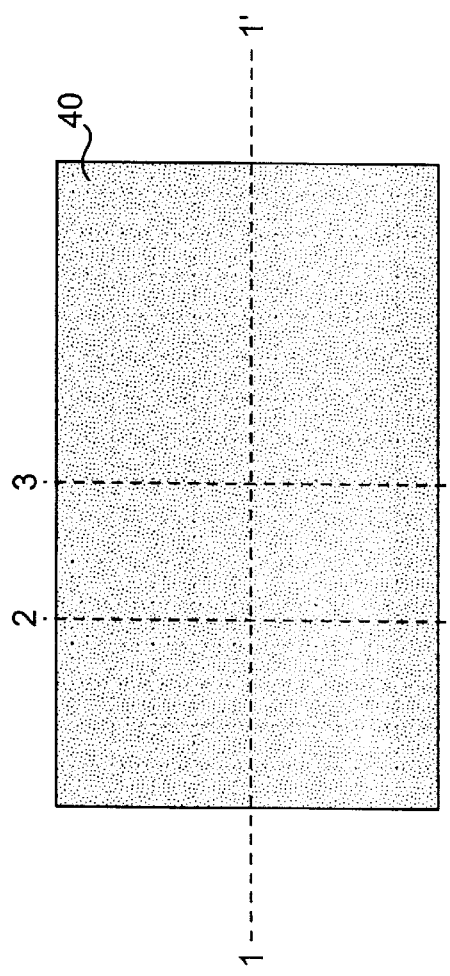
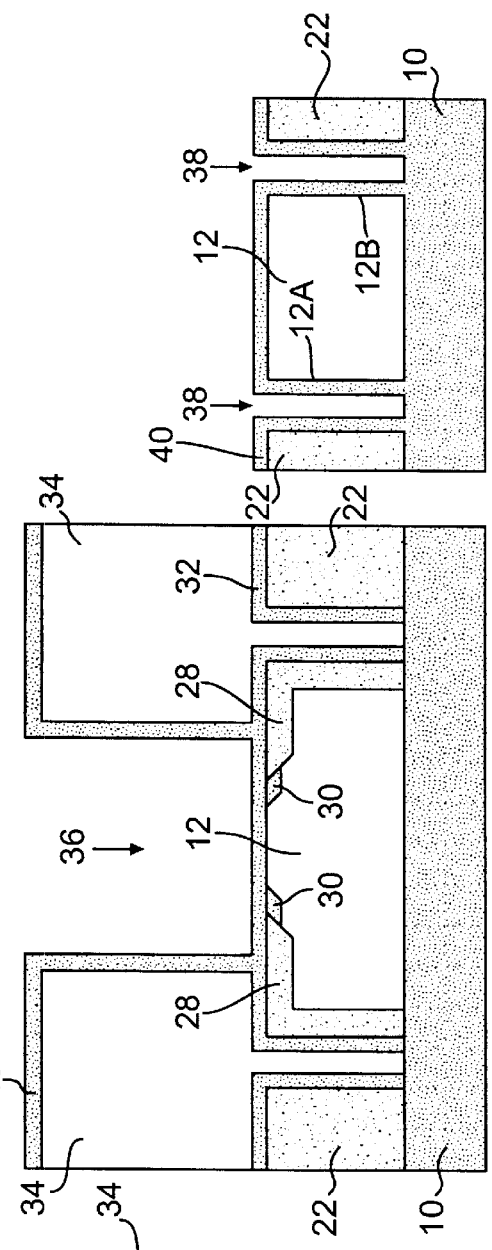

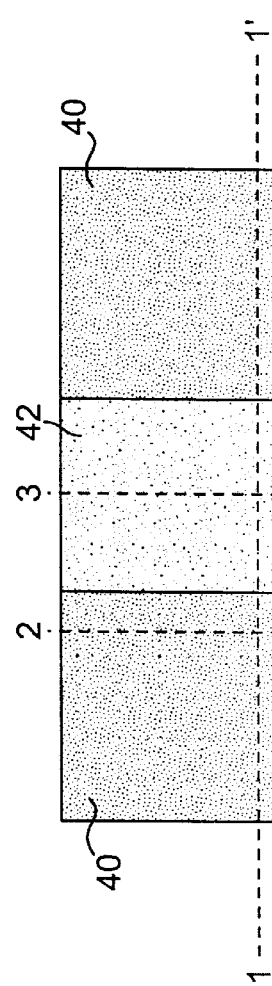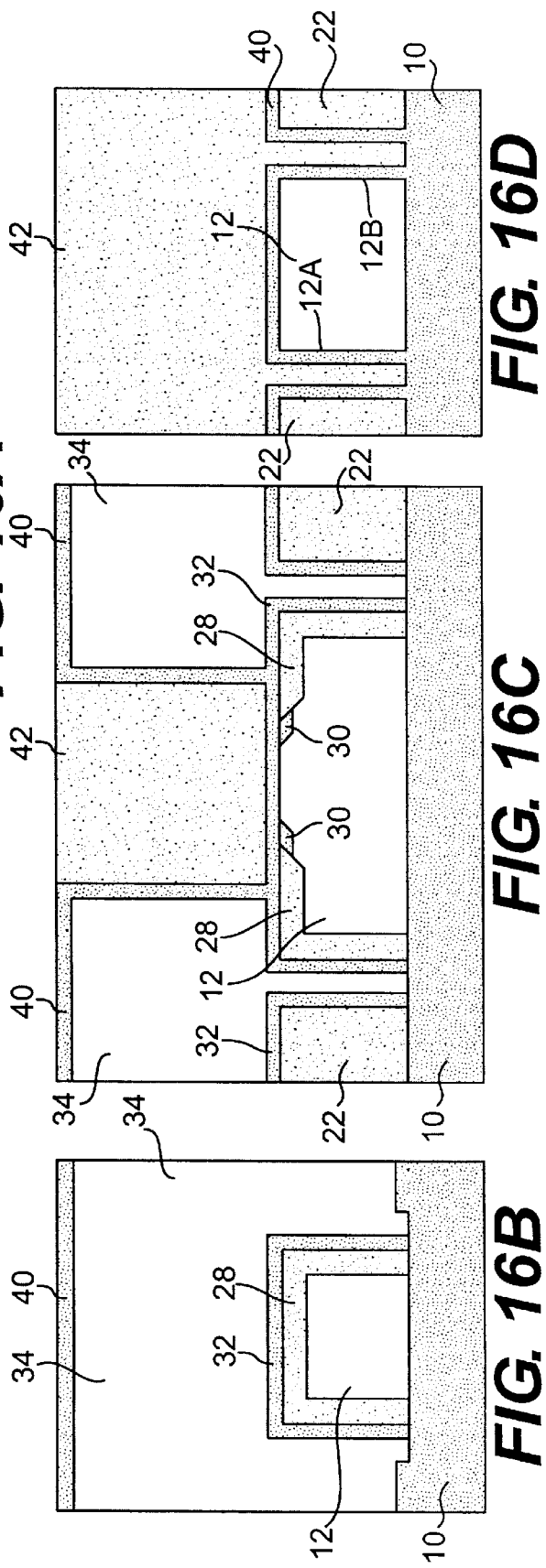

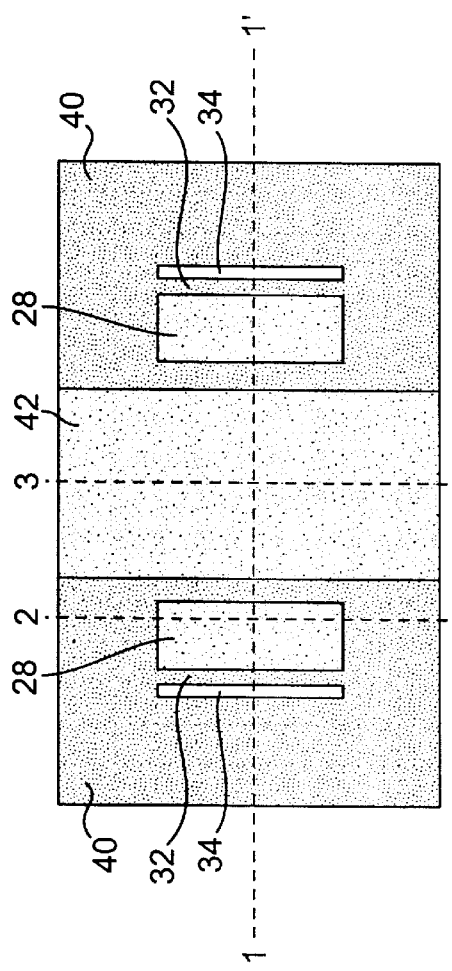
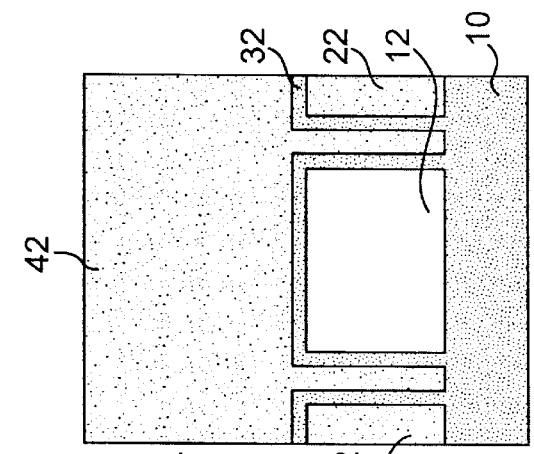
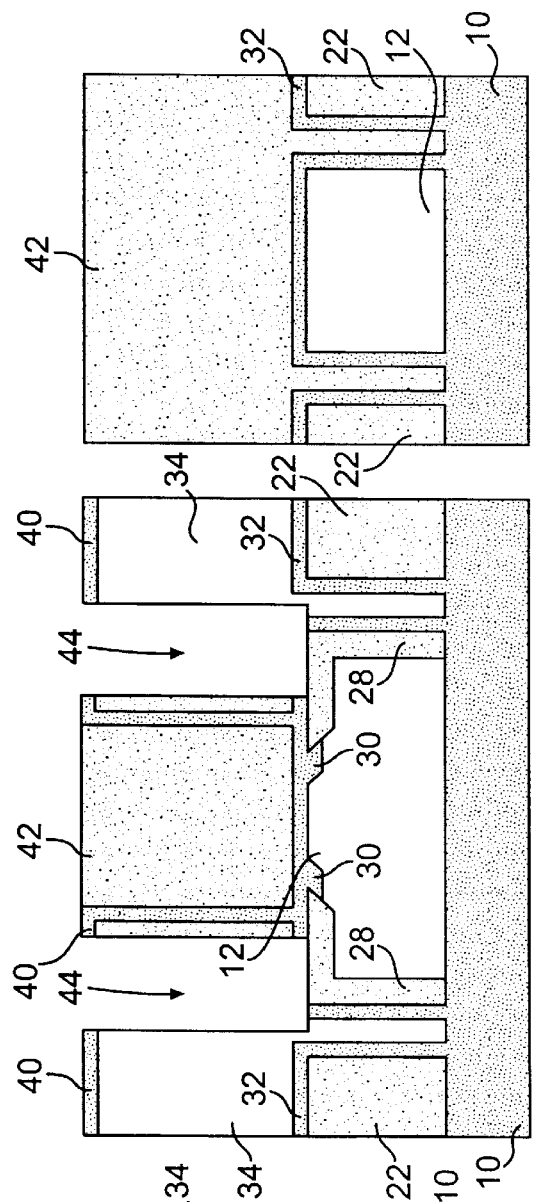
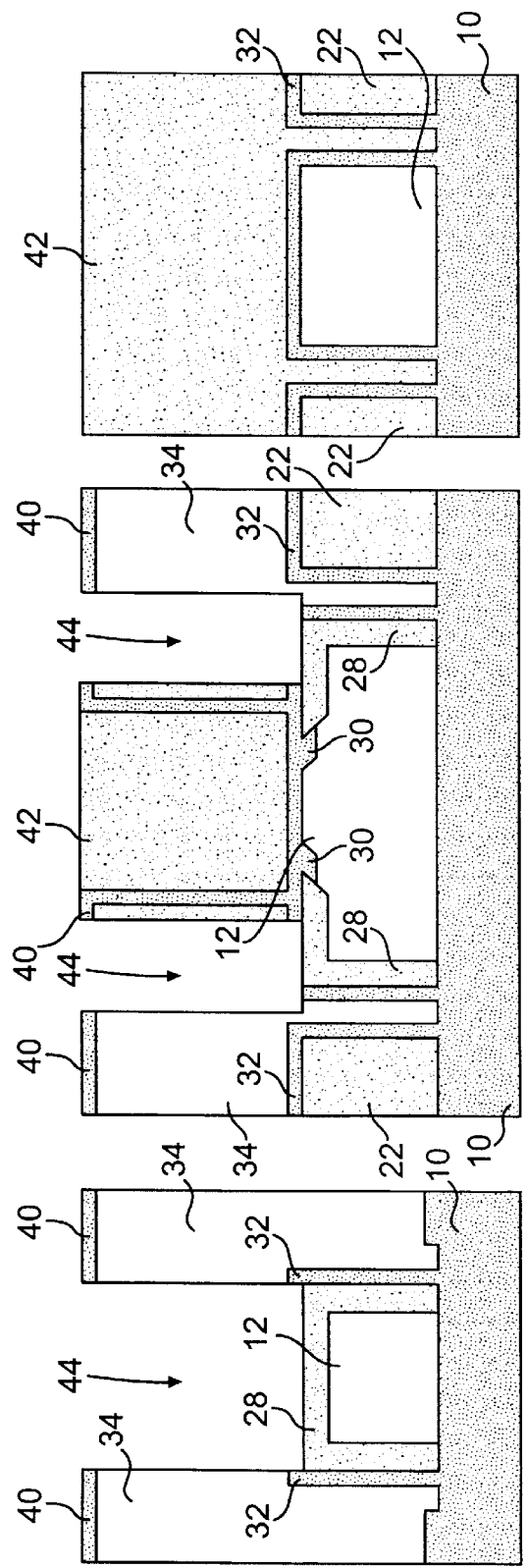

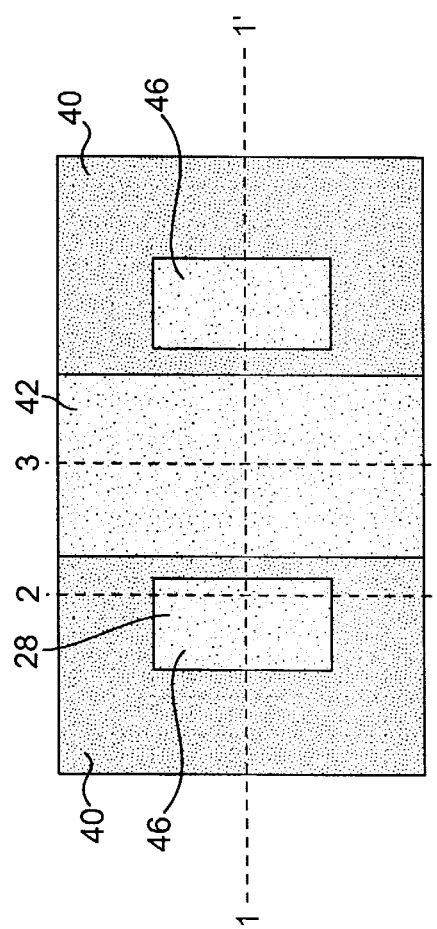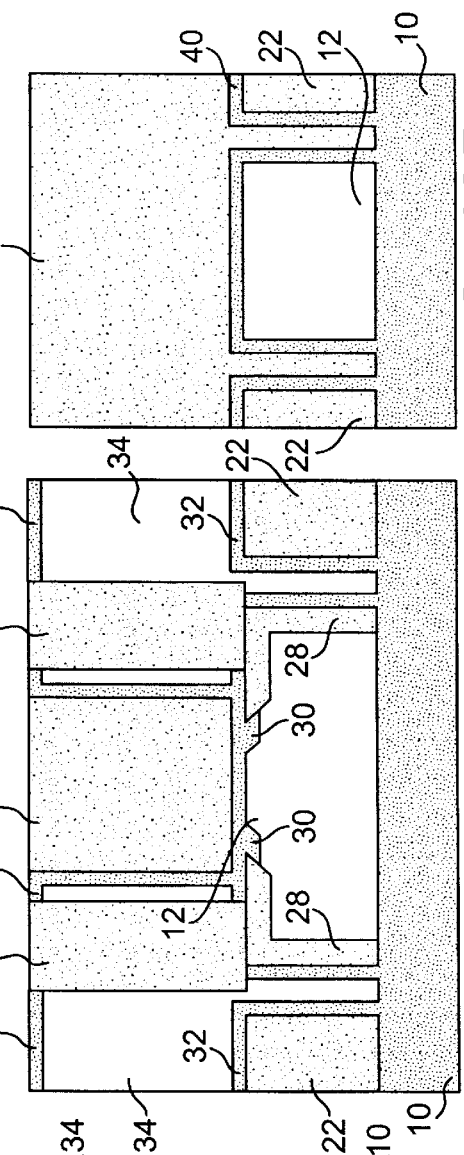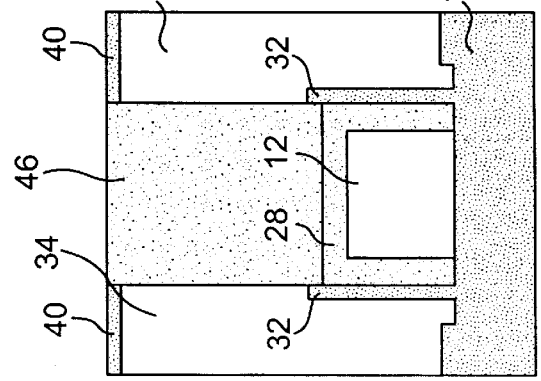

METHOD FOR WRAPPED-GATE MOSFET

DESCRIPTION

Background of the Invention

1. Field of the Invention

The present invention generally relates to the fabrication of metal oxide semiconductor field effect transistors (MOSFET) and, more particularly, to a MOSFET devices having a wrapped-gate structure.

2. Background Description

The escalating requirements for high performance and density associated with ultra large scale integration semiconductor devices require high speed and reliability and increased manufacturing throughput for competitiveness.

Integrated circuits, including transistors, are typically formed from either bulk silicon starting material, silicon on insulator (SOI) starting material, or SOI material that is formed from a bulk semiconductor starting material during processing. A gate dielectric layer, typically an oxide, is formed on the starting material (i.e., substrate) and a gate electrode, typically polysilicon, is formed on the gate dielectric layer. Source and drain regions are formed in the substrate, typically by ion implantation, and the region underlying the gate electrode serves as a channel region between the source and drain regions.

As device size shrinks, the industry has been observing new problems and challenges which have not been accompanied with the relatively larger devices with lower density. Among them, the major challenges are to achieve better gate control of the substrate potential for a steeper sub-threshold slope and a lower sensitivity to the "body to source" voltage, to increase an effective gate width, to improve the short channel effect and to reduce the kink effect. Therefore, there has been a need for a new transistor operation scheme which provides solutions to those problems and challenges.

SUMMARY OF THE INVENTION

An object of the present invention is to provide an improved transistor structure which provides an improved gate control of the substrate potential, a steep sub-threshold slope, and low sensitivity to the "body-to-source" voltage.

Additional advantages and other features of the present invention will be set forth in part in the description which follows and will become apparent to those having ordinary skill in the art upon examination of the following or may be learned from the practice of the present invention. The advantages of the present invention may be realized and obtained as particularly pointed out in the appended claims.

According to the present invention, the foregoing and other objectives are achieved in part by a semiconductor device comprising a substrate having an upper surface and first and second side surfaces substantially parallel to each other. A channel region is arranged between the first and second side surfaces within the substrate. Source and drain regions are formed in the substrate and separated by the channel region. A gate electrode is arranged on the upper surface and the first and second side surfaces of the substrate with a gate oxide therebetween.

Another aspect of the present invention is a method for manufacturing a semiconductor device comprising the step of forming a substrate having an upper surface and first and second side surfaces. Source and drain regions are formed in the substrate with a channel region therebetween. A gate oxide is formed on the upper surface and the first and second side surfaces of the substrate to cover the channel region. A gate electrode is formed on the gate oxide such that the gate electrode overlies the channel region from said upper surface and the first and second side surfaces of the substrate.

Additional advantages of the present invention will become readily apparent to those skilled in this art from the following detailed description, wherein a preferred embodiment of the present invention is shown and described. As will be realized, the present invention is capable of other and different embodiments and its several details are capable of modifications in various respects, all without departing from the present invention. Accordingly, the drawings and description are to be regarded as illustrative in nature, and not restrictive.

BRIEF DESCRIPTION OF THE DRAWINGS

The foregoing and other objects, aspects and advantages will be better understood from the following detailed description of a preferred embodiment of the invention with reference to the drawings, in which:

FIG. 1A depicts a top view of a portion of an SOI substrate on which a nitride pad layer is formed with a dummy gate oxide layer therebetween, in accordance with an embodiment of the present invention.

FIG. 1B depicts a cross-sectional view dissected along line 2–2' of the portion shown in FIG. 1A.

FIG. 1C depicts a cross-sectional view dissected along line 1–1' of the portion shown in FIG. 1A.

FIG. 1D depicts a cross-sectional view dissected along line 3–3' of the portion shown in FIG. 1A.

FIG. 2A depicts the portion of FIG. 1A after an recess etching step, in which a top silicon layer of the SOI substrate is etched to have four side surfaces.

FIG. 2B depicts the portion of FIG. 1B after the recess etching step, and particularly depicts the first and second side surfaces of the top silicon layer are exposed.

FIG. 2C depicts the portion of FIG. 1C after the recess etching step, and particularly depicts the third and fourth side surfaces of the top silicon layer are exposed.

FIG. 2D depicts the portion of FIG. 1D after the recess etching step, and particularly depicts the first and second side surface of the top silicon layer are exposed.

FIG. 3A depicts the portion of FIG. 2A after an oxidation step to form oxide sidewalls on the exposed side surfaces of the top silicon layer, and an amorphous silicon deposition step and an amorphous silicon etching step to form amorphous silicon sidewalls on the oxide sidewalls.

FIG. 3B depicts the portion of FIG. 2B after the oxidation, amorphous silicon deposition and amorphous silicon etching steps, and particularly depicts that the first and second side surfaces of the top silicon layer are covered by the amorphous silicon sidewalls with the oxide sidewalls therebetween, respectively.

FIG. 3C depicts the portion of FIG. 2C, after the oxidation, amorphous silicon deposition and amorphous silicon etching steps, and particularly depicts that the third and fourth side surfaces of the top silicon layer are covered by the amorphous silicon sidewalls with the oxide sidewalls therebetween, respectively.

FIG. 3D depicts the portion of FIG. 2D, after the oxidation, amorphous silicon deposition and amorphous silicon etching steps, and particularly depicts that the first and second side surfaces of the top silicon layer are covered by the amorphous silicon sidewalls with the oxide sidewalls therebetween, respectively.

FIG. 5A depicts the portion of FIG. 4A, after a nitride pad layer stripping step to expose the dummy gate oxide layer and an etching step to remove the upper portions of the filling oxide and amorphous silicon and FIG. 5B depicts the portion of FIG. 4B, after the nitride pad layer stripping step and the filling oxide and amorphous silicon etching step, and particularly depicts that the dummy gate oxide layer is exposed.

FIG. 5C depicts the portion of FIG. 4C, after the nitride pad layer stripping step and the filling oxide and amorphous silicon etching step, and particularly depicts that the dummy gate oxide layer is exposed.

FIG. 5D depicts the portion of FIG. 4D, after the nitride pad layer stripping step and the filling oxide and amorphous silicon etching step, and particularly depicts that the dummy gate oxide layer is exposed.

FIG. 7A depicts the portion of FIG. 6A, after a polysilicon etching step to form a dummy gate which selectively exposes portions of the dummy gate oxide layer adjoining the third and fourth side surfaces of the top silicon layer, and an amorphous silicon etching step to remove portions of the amorphous silicon not covered by the dummy gate.

FIG. 7B depicts the portion of FIG. 6B, after the polysilicon etching step and the amorphous silicon etching step, in which the portion of the polysilicon overlying the dummy gate oxide layer is removed, and the portion of the amorphous silicon material that is not covered by the patterned dummy gate above is removed.

FIG. 7C depicts the portion of FIG. 6C, after the polysilicon etching step and the amorphous silicon etching step, in which the dummy gate is formed on the dummy gate oxide layer to selectively expose the portions of the dummy gate oxide layer adjoining the third and fourth side surfaces of the top silicon layer, and the portions of the amorphous silicon on the third and fourth side surfaces of the top silicon layer are removed.

FIG. 7D depicts the portion of FIG. 6D, after the polysilicon etching step and the amorphous silicon etching step, in which the dummy gate is formed on the dummy gate oxide layer protecting the amorphous silicon thereunder from being etched during the amorphous silicon etching step.

FIG. 10A depicts the portion of FIG. 9A after a dummy gate oxide layer etching step, in which the edge portions of the dummy gate oxide layer adjoining the source and drain regions are etched out, and a source/drain extension doping to form source/drain extensions via the newly exposed portions of the top silicon layer.

FIG. 10B depicts the portion of FIG. 9B after the dummy gate oxide layer etching step and the source/drain extension doping step.

FIG. 10C depicts the portion of FIG. 9C after the dummy gate oxide layer etching step and the source/drain extension doping step, in which the edge portion of the dummy gate oxide layer adjoining the source and drain regions are etched out and the source/drain extensions are formed between the source/drain regions and the channel region.

FIG. 10D depicts the portion of FIG. 9D after the dummy gate oxide layer etching step and the source/drain extension doping step.

FIG. 11A depicts a top view of the portion shown in FIG. 10A dissected along the line 4–4' of FIG. 11B, and particularly depicts that the source/drain extensions are formed in the four corners of the channel region.

FIG. 11B depicts a cross-sectional view dissected along line 5–5' of FIG. 11A, and particularly depicts the source/ drain extensions are formed along the interface region between the source/drain regions and the channel region.

Figure 4A:
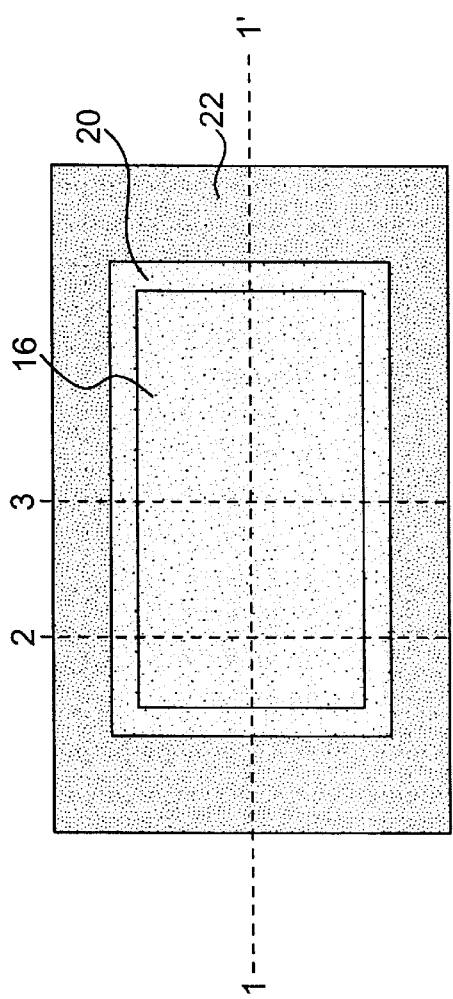
FIG. 4A depicts the portion of FIG. 3A, after an oxide deposition step to fill the void surrounding the amorphous silicon sidewalls with a filling oxide, and a planarization step to expose the nitride pad layer.
Figure 4D:
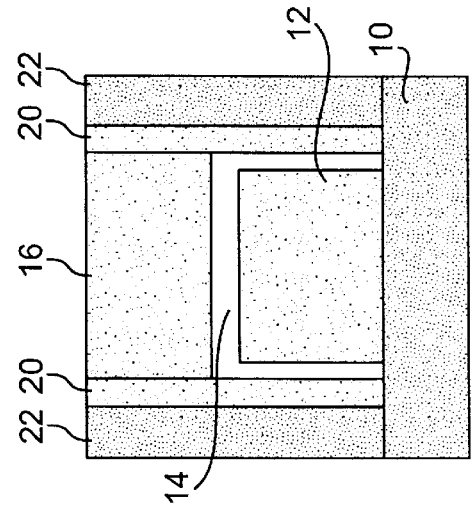
FIG. 4D depicts the portion of FIG. 3D, after the oxide deposition step and planarization step, and particularly depicts the void adjacent to the first and second side surfaces of the top silicon layer is filled by the filling oxide.
Figure 4C:
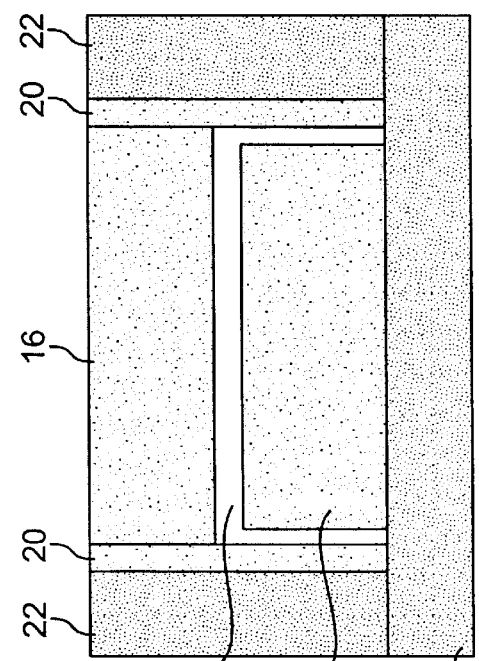
FIG. 4C depicts the portion of FIG. 3C, after the oxide deposition step and planarization step, and particularly depicts that the void adjacent to the third and fourth side surfaces of the top silicon layer is filled by the filling oxide.
Figure 4B:
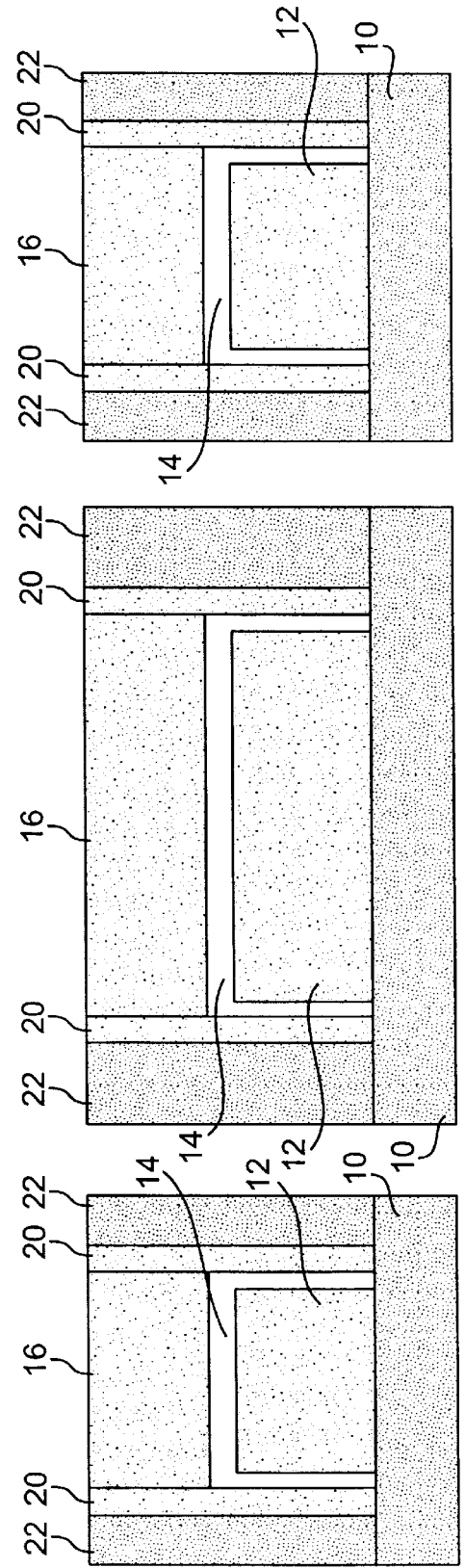
FIG. 4B depicts the portion of FIG. 3B, after the oxide deposition step and planarization step, and particularly depicts that the void adjacent to the first and second side surfaces of the top silicon layer is filled by the filling oxide.
Figures 6A, 6B, 6C, 6D:
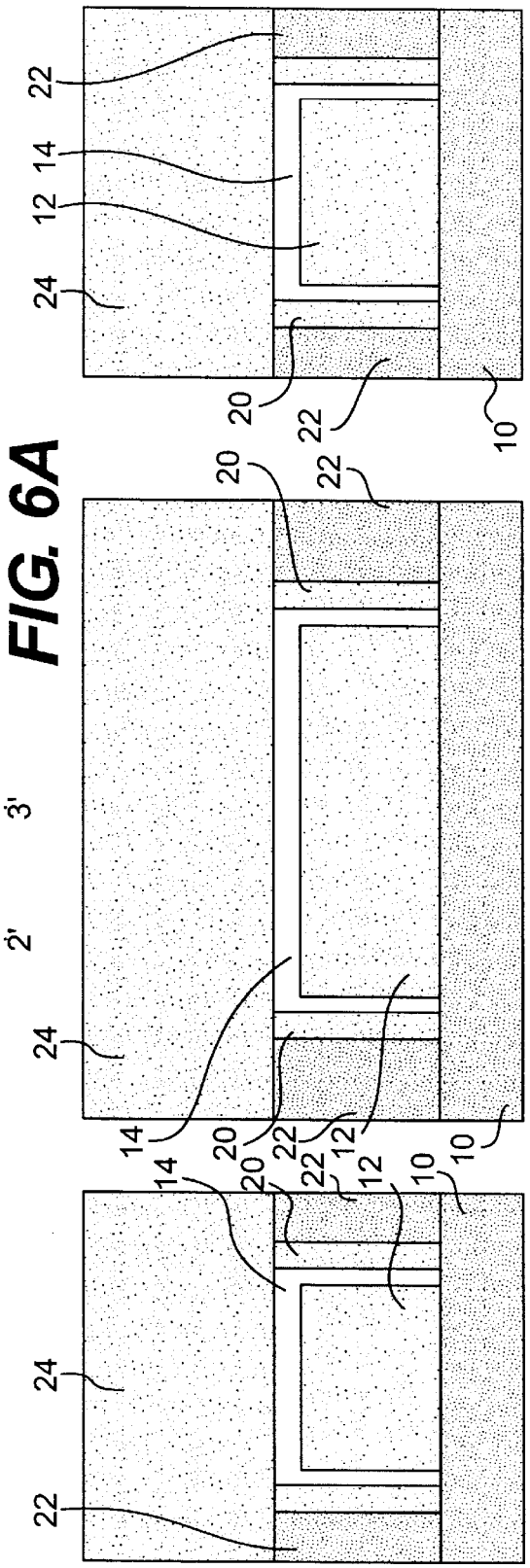
FIG. 6A depicts the portion of FIG. 5A, after a polysilicon deposition step, in which polysilicon is deposited over the entire structure shown in FIG. 5A.
FIG. 6B depicts the portion of FIG. 5B, after the polysilicon deposition step, in which polysilicon is deposited over the entire structure shown in FIG. 5B.
FIG. 6C depicts the portion of FIG. 5C, after the polysilicon deposition step, in which polysilicon is deposited over the entire structure shown in FIG. 5C.
FIG. 6D depicts the portion of FIG. 5D, after the polysilicon deposition step, in which polysilicon is deposited over the entire structure shown in FIG. 5D.

FIG. 11C depicts a cross-sectional view dissected along line 6–6' of FIG. 11A.

FIG. 12A depicts the portion of FIG. 10A after a nitride liner depositing step and oxide deposition/planarization steps.

FIG. 12B depicts the portion of FIG. 10B after the nitride liner depositing step and oxide deposition/planarization steps.

FIG. 12C depicts the portion of FIG. 10C after the a nitride liner depositing step and oxide deposition/planarization steps.

FIG. 12D depicts the portion of FIG. 10D the nitride liner depositing step and oxide deposition/planarization step.

FIG. 13A depicts the portion of FIG. 12A after a nitride etching step and a polysilicon etching step to remove the dummy gate electrode.

FIG. 13B depicts the portion of FIG. 12B after the nitride etching step and the polysilicon etching step.

FIG. 13C depicts the portion of FIG. 12C after the nitride etching step and the polysilicon etching step, in which the dummy gate electrode is removed.

FIG. 13D depicts the portion of FIG. 12D after the nitride etching step and the polysilicon etching step, in which the dummy gate electrode is removed as well as the amorphous silicon between the silicon island and the filling oxide.

FIG. 14A depicts the portion of FIG. 13A after an oxide etching step and a nitride etching step, in which the dummy gate oxide layer and the exposed portion of the nitride liner are removed.

FIG. 14B depicts the portion of FIG. 13B after the oxide etching step and the nitride etching step.

FIG. 14C depicts the portion of FIG. 13C after the oxide etching step and the nitride etching step, in which the dummy gate oxide layer and the exposed portion of the nitride liner are removed.

FIG. 14D depicts the portion of FIG. 13D after the oxide etching step and the nitride etching step, in which the dummy gate oxide layer which was covering the upper surface and the fist and second side surfaces of the top silicon layer is removed.

FIG. 15A depicts the portion of FIG. 14A after a gate dielectric deposition step, in which the entire structure shown in FIG. 14A is covered by a gate dielectric layer.

FIG. 15B depicts the portion of FIG. 14B after the gate dielectric deposition step.

FIG. 15C depicts the portion of FIG. 14C after the gate dielectric deposition step, and particularly depicts that the gate dielectric layer is formed on the channel region of the top silicon layer.

FIG. 15D depicts the portion of FIG. 14D after the gate dielectric deposition step, and particularly depicts the gate dielectric layer is formed on the upper surface and first and second side surfaces of the top silicon layer.

FIG. 16A depicts the portion of FIG. 15A after a conductive material deposition step and a planarization step to form a gate electrode.

FIG. 16B depicts the portion of FIG. 15B after the conductive material deposition step and the planarization step.

FIG. 16C depicts the portion of FIG. 15C after the conductive material deposition step, and particularly depicts the gate electrode is formed on the gate dielectric layer.

FIG. 16D depicts the portion of FIG. 15D after the conductive material deposition step, and particularly depicts that the gate electrode is formed on the upper surface and the first and second side surfaces of the top silicon layer with the gate dielectric layer therebetween.

FIG. 17A depicts the portion of FIG. 16A after forming recesses exposing the source/drain regions.

FIG. 17B depicts the portion of FIG. 16B after the forming the recesses exposing the source/drain regions, and particularly depicts that the recess extending to the upper surface of the top silicon layer.

FIG. 17C depicts the portion of FIG. 16C after the forming the recesses exposing the source/drain regions.

FIG. 17D depicts the portion of FIG. 16D after the forming the recesses exposing the source/drain regions.

FIG. 18A depicts the portion of FIG. 17A after filling the recesses with the conductive materials to form source/drain contacts.

FIG. 18B depicts the portion of FIG. 17B after filling the recesses with the conductive materials to form source/drain contacts.

FIG. 18C depicts the portion of FIG. 17C after filling the recesses with the conductive materials to form source/drain contacts.

FIG. 18D depicts the portion of FIG. 17D after filling the recesses with the conductive materials to form source/drain contacts.

DETAILED DESCRIPTION OF A PREFERRED EMBODIMENT OF THE INVENTION

The present invention provides an improved gate control scheme by forming a wrapped gate electrode which surrounds a channel region from multiple dimensions.

Referring now to the drawings, and more particularly to FIGS. 1A–1D, there is shown a structure formed based on an SOI substrate. The SOI substrate includes a buried insulation layer 10, a top silicon layer 12 formed on the buried insulation layer 10. A bottom silicon substrate on which the buried insulation layer 10 is formed is not shown. As shown in FIGS. 1B, 1C and 1D, the structure further includes a dummy gate oxide layer 14 formed on the top silicon layer 12 and a nitride pad layer 16 formed on the dummy gate oxide layer 14.

As shown in FIG. 1A which depicts the top view of the structure, the pad nitride layer 16 is entirely covering the structure. FIG. 1B depicts a cross-sectional view of the structure dissected by dotted line 2–2'. FIG. 1C depicts a cross-section view of the structure dissected by dotted line 1–1'. FIG. 1D depicts a cross-section view of the structure dissected by dotted line 3–3'. As shown in FIGS. 1A–1D, the nitride pad layer 16 is evenly disposed on the SOI substrate with the dummy gate oxide layer 14 therebetween.

As shown in FIGS. 2A–2D, the structure can be masked and patterned by conventional lithographic and etching techniques. According to an embodiment of the present invention, the structure is patterned such that the top silicon layer 12 has the first, second, third and fourth side surfaces 12A, 12B, 12C, 12D as shown in FIG. 2A. The patterned top silicon layer 12 will be also referred to as "silicon island" because it is surrounded by a void. However, it is not necessary to shape the top silicon layer 12 to have the four side surfaces, as shown in this particular embodiment. Rather, as long as the first and second side surfaces are provided to a semiconductor substrate, in addition to an upper surface thereof, it would be possible to implement the present invention.

In FIG. 2A, the silicon island 12 is indicated by dotted box. Although it is not necessary, in FIG. 2A, the first and second side surfaces A and B are opposing and parallel to each other. The third and fourth side surfaces 12C and 12D are also opposing and parallel to each other, and at the same time perpendicular to the first and second side surfaces. FIGS. 2B and 2D also show the first and second side surfaces 12A and 12B of the silicon island 12, and FIG. 2C shows the third and fourth side surfaces 12C and 12D of the silicon island 12.

Preferably, an isotropic silicon horizontal recess etching is performed so that, when the silicon island 12 is shaped, the exposed side surface portions are selectively etched laterally little bit further than the overlying dummy gate oxide layer 14 or the nitride pad layer 16, as shown in FIGS. 2A–2D. The degree of lateral recess should be just enough to compensate for the volume expansion of the oxide sidewalls 18 during the thermal oxidation of the four side surfaces of the silicon island 12, i.e., the edge of the nitride pad layer 16, the dummy gate oxide layer 14, and the oxide sidewalls 18 should for a plumb line after the oxide sidewall 18 is formed.

As shown in FIGS. 3A–3D, oxide sidewalls 18 are formed on the exposed side surfaces 12A, 12B, 12C and 12D of the silicon island 12 by thermal oxidation. Subsequently, amorphous silicon is deposited over the entire structure and an etching step, preferably reactive ion etching, is performed so that an amorphous silicon layer 20 is selectively formed on the side surfaces of the nitride pad layer 16 and the oxide sidewalls 18 covering the silicon island 12.

FIGS. 4A–4D depict the structure after the void surrounding the amorphous silicon 20 is filled by a filling oxide 22. The filling oxide 22 is preferably formed by depositing an oxide over the entire structure and planarizing to expose the nitride pad layer 16 preferably by chemical mechanical polishing. As shown in FIGS. 5A–5D, an etching step is performed to remove an upper portions of the filling oxide 22 and the amorphous silicon 20, and the nitride pad layer 16 is removed to expose the dummy gate oxide layer 14.

Subsequently, as shown in FIGS. 6A–6D, polysilicon 24 is deposited over the entire structure. As depicted in FIGS. 7A–7D, the polysilicon layer 24 is patterned, by conventional lithographic and etching techniques, to form a dummy polysilicon gate 24. Subsequently, the portions of the amorphous silicon 20 not blocked by the dummy polysilicon gate electrode 24 are removed, preferably by conventional silicon over-etching techniques.

As particularly shown in FIG. 7A, the dummy polysilicon gate 24 is patterned to extend to the direction substantially perpendicular to the first and second side surfaces 12A and 12B of the silicon island 12, and exposes the portions 14A and 14B of the upper surface of the dummy gate oxide layer 14. The portion 14A is proximate to the third side surface 12C of the silicon island 12 and the portion 14B is proximate to the fourth side surface 12D of the silicon island 12.

FIG. 7B particularly depicts a cross-sectional view of the structure dissected along line 2–2' of FIG. 7A. Since the dissected portion of the structure shown in FIG. 7B is not covered by the polysilicon dummy gate electrode 24, the amorphous silicon 20 is removed, thereby forming recesses 26. Contrarily, FIG. 7D depicts a cross-sectional view of the structure dissected along line 3–3' of FIG. 7A. Since the dissected portion shown in FIG. 7D is covered by the polysilicon dummy gate electrode 24, the amorphous silicon 20 underlying the polysilicon dummy gate electrode 24 is protected from being etched out. Thus, as shown in FIGS. 7B, 7C and 7D, recesses 26 are formed around the side surfaces of the oxide sidewalls 18 except for the portions of the amorphous silicon 20 masked by the dummy gate electrode 24.

Figure 8A:
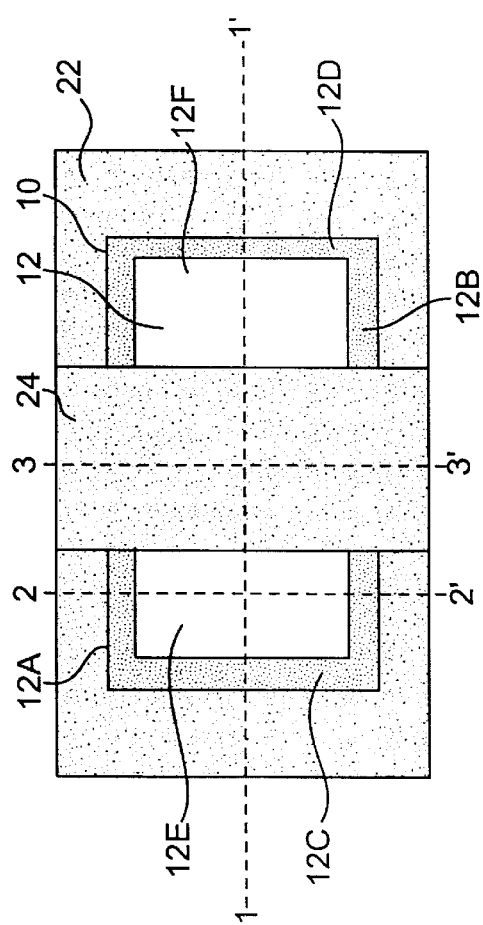
FIG. 8A depicts the portion of FIG. 7A after an oxide etching step, in which the dummy gate oxide layer and filling gate oxide are removed except for the portions covered by the dummy gate electrode.
Figure 8D:
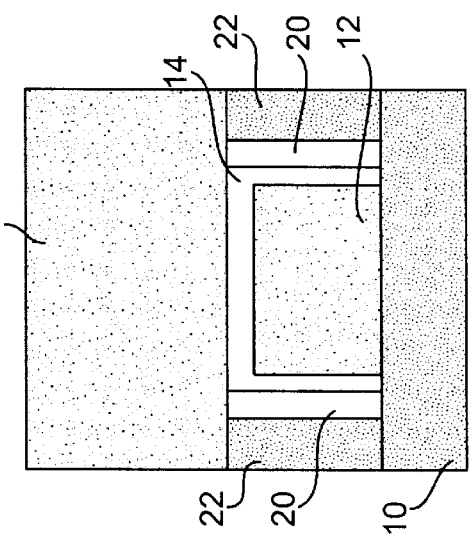
FIG. 8D depicts the portion of FIG. 8C after the oxide etching step, in which the dummy gate oxide layer covered by the dummy gate electrode is protected from etching.
Figure 8C:
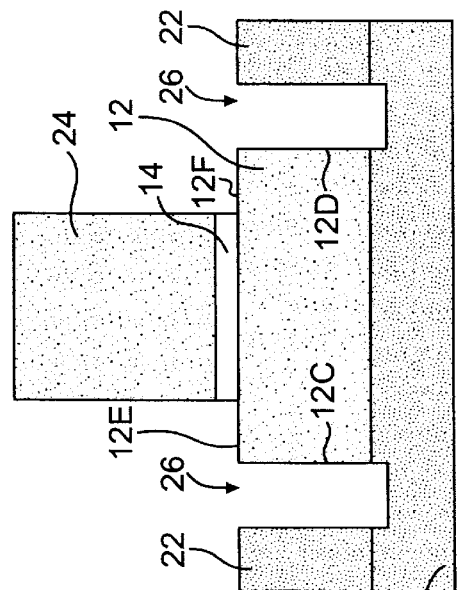
FIG. 8C depicts the portion of FIG. 7C after the oxide etching step, in which the third and fourth side surfaces of the top silicon layer and the portions of the upper surface of the top silicon layer adjoining the third and fourth side surfaces thereof are exposed.
Figure 8B:
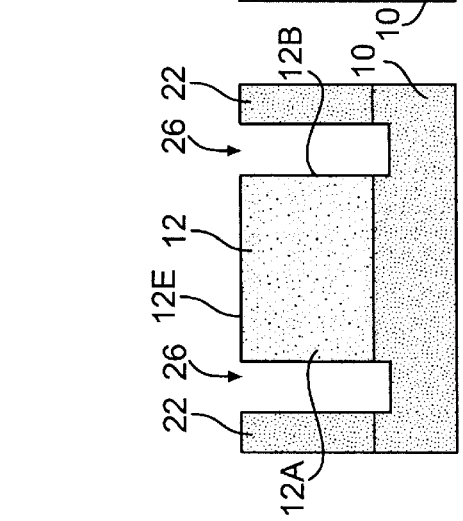
FIG. 8B depicts the portion of FIG. 7B after the oxide etching step, in which the portions of the dummy gate oxide layer and filling gate oxide are removed to expose the portions of the upper surface of the top silicon layer and the first and second side surfaces of the top silicon layer.

As shown in FIGS. 8A–8D, the oxide sidewalls 18 and the dummy gate oxide layer 14 are removed except for the portions covered by the dummy gate electrode 24, preferably by a reactive ion etching (RIE) step and an oxide wet etching step. During the etching steps, in addition to the removal of the exposed oxide sidewalls 18, the side surfaces of the filling oxide 22 are also etched, thereby laterally expanding the recesses 26, as shown in FIGS. 8A, 8B and 8C. However, the portion of the structure covered by the dummy gate electrode 24 is protected from the etching steps, as shown in FIG. 8D.

FIGS. 9A–9D depict the structure after a source/drain doping step. In this embodiment, the source/drain regions are formed by gas phase doping or plasma doping by using the dummy gate electrode 24 as a mask. Previously, the dummy gate oxide layer 14 has been removed except for the portion covered by the dummy gate electrode 24, thereby exposing the first and second portions 12E and 12F of the upper surface of the silicon island 12. Also, the oxide sidewalls 18 have been removed except for the portion covered by the dummy gate electrode 24, thereby exposing the third and fourth side surfaces 12C and 12D of the silicon island 12. Further, the oxide sidewalls 18 covering the first and second side surfaces 12A and 12B of the silicon island 12 were removed except for the portion blocked by the dummy gate electrode 24. Therefore, the portions of the first and second side surfaces 12A and 12B adjoining the third side surface 12C and the exposed first portion 12E of the upper surface of the silicon island 12 are exposed likewise, the portions of the first and second side surfaces A and B adjoining the fourth side surface 12D and the exposed second portion 12F of the upper surface of the silicon island 12 are exposed.

If the aspect ratio of the recess 26 is small, that is, if the recess is shallow relative to the width, ion implantation may be substituted for gas phase doping or plasma doping. This substitution would work as long as the geometric shading during ion implantation is negligible, in which case enough dopant is delivered to the bottom of the silicon island relative to the top surface. As the aspect ratio increase, however, the effect of geometric shading becomes severer so that there is less dopant at the bottom of the silicon island 12 then the top, resulting in nonuniform threshold voltage and potentially rendering the device less desirable. In this regard, gas phase doping or plasma doping, which delivers about the same level of doping irrespective of geometry, is preferred for their compatibility with fabrication of devices with higher current density.

Figure 9A:
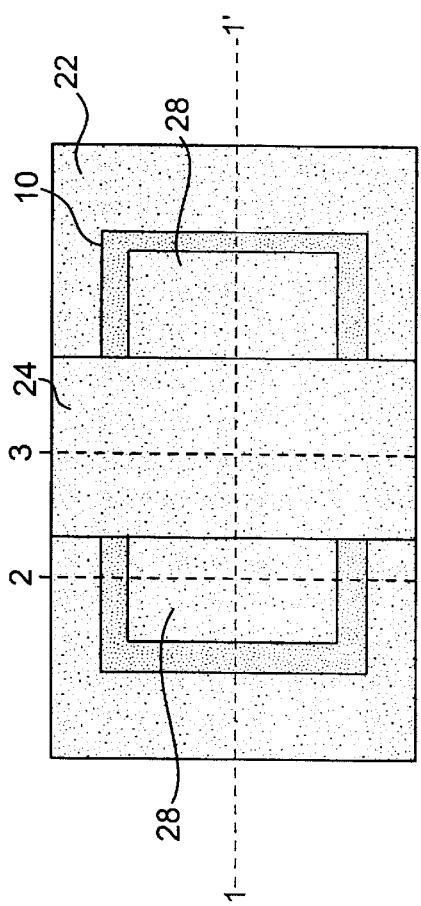
FIG. 9A depicts the portion of FIG. 8A after a source/drain doping step, in which source and drain regions are formed on the exposed portions of the top silicon layer.
Figure 9D:
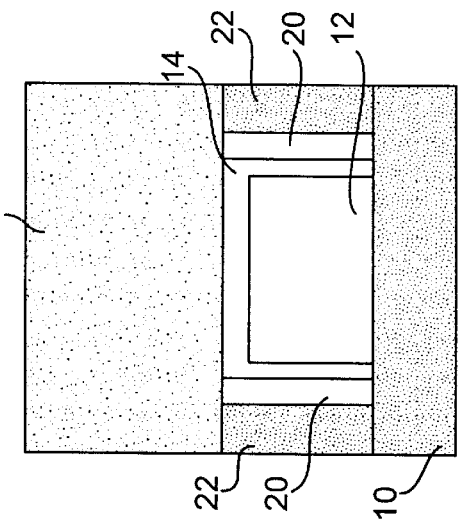
FIG. 9D depicts the portion of FIG. 8D after the source/drain doping step, in which doping in this area is blocked by the dummy gate electrode, thereby forming a channel region between the source and drain regions.
Figure 9C:
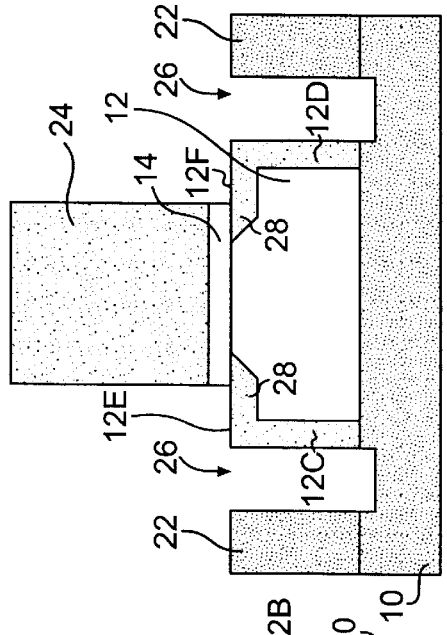
FIG. 9C depicts the portion of FIG. 8C after the source/drain doping step, in which the source/drain regions are formed in the top silicon layer and the third and fourth side surfaces.
Figure 9B:
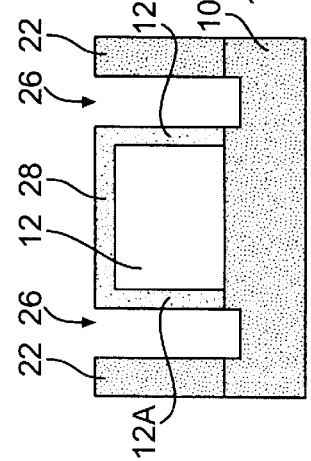
FIG. 9B depicts the portion of FIG. 8B after the source/drain doping step, in which the source/drain regions are formed in the top silicon layer and the first and second side surfaces.

The source/drain regions 28 are formed preferably by gas phase doping or plasma doping by utilizing the dummy gate electrode 24 as a mask. According to an embodiment of the present invention, the source/drain regions 28 are formed in the exposed upper surface portions 12E and 12F of the silicon island 12 and further extend to the third and fourth side surfaces 12C and 12D and the exposed portions of the first and second side surfaces 12A and 12B. More specifically, as shown in FIG. 9C, the source/drains region 28 extends from the upper surface of the silicon island 12 to the third and fourth side surfaces 12C and 12D, respectively. Also, as shown in FIG. 9B, the source/drain regions 28 extends from the upper surface of the silicon island 12 to the first and second side surfaces 12A and 12B of the silicon island 12. However, as shown in FIG. 9D, the portions of the upper surface and first and second side surfaces 12A and 12B masked by the dummy gate electrode 24 are protected from the source/drain doping, thereby forming a channel region located between the source/drain regions 28. Optionally, an additional source/drain doping by ion implantation may be performed to increase the doping level only below the surface 12E and 12F, if desired.

As shown in FIGS. 10A–10D, the exposed edge portions of dummy gate oxide layer 14 are etched for the subsequent source/drain extension formation step. Particularly, FIG. 10C depicts the exposed edge portions of the dummy gate oxide layer 14 are selectively etched out. Preferably, wet etching is performed for the selective dummy gate oxide layer etching. Subsequently, a source/drain extension doping is performed by using the dummy gate electrode 24 and the dummy gate oxide layer 14, preferably by gas phase doping or plasma doping, to form the source/drain extensions 30.

FIGS. 11A–11C depict different cross-section views of the structure shown in FIGS. 10A–10D to explain how the source/drain extensions 30 are formed in the upper and side surfaces of the silicon island 12. FIG. 1A is a cross-sectional view of the structure shown in FIG. 10A dissected along line 4–4' of FIG. 11B. FIG. 11B is a cross-sectional view of the structure shown in FIG. 11A dissected along the 5–5' of FIG. 11A. FIG. 11C is a cross-sectional view of the structure shown in FIG. 11A dissected along line 6–6'.

As shown in FIG. 10C, the source/drain extensions 30 are formed along the interface between the source/drain regions 28 and the channel region in the upper surface of the silicon island 12. As shown in FIG. 11A, The source/drain extensions 30 are also formed along the interface between the source/drain regions 28 and the channel region in the first and second side surfaces 12A and 12B of the silicon island 12. Therefore, two bands of the source/drain extensions 30 are shaped like an inverted "U" without the corner rounding over the silicon island 12 and place between the channel and the source and drain.

Subsequently, as shown in FIGS. 12A–12D, an interlayer dielectric layer 34, preferably an oxide is deposited over the structure and planarized preferably by chemical mechanical polishing (CMP). Prior to forming the interlayer dielectric layer 34, a nitride liner 32 can be deposited. This enables use of BPSG (borophospho silicate glass) as the interlayer dielectric material and also prevents dopant diffusion between the oxide interlayer dielectric layer 34 and the doped source/drain regions 28. The planarization is performed to expose the portion of the nitride liner 32 overlying the dummy gate electrode 24.

As depicted in FIGS. 13A to 13D, the dummy gate electrode 24 is removed. The exposed portion of the nitride liner 32 is first removed preferably by reactive ion etching (RIE) and the dummy gate electrode 24 is removed preferably by polysilicon reactive ion etching selective to the dummy gate oxide 14. This forms a recess 36, as shown in 13C and exposes the amorphous silicon 20. Then the amorphous silicon 20 which was previously masked by the dummy gate electrode 24 is removed by continuation of silicon RIE selective to oxide, as shown in FIG. 13D, thereby forming recesses 38.

Subsequently, as shown in FIGS. 14A–14D, the dummy gate oxide layer 14 and the portions of the nitride liner 32 exposed in the recess 36 are removed preferably by wet etching. As depicted in FIGS. 13D, in the previous step, the dummy gate oxide layer 14 and the oxide sidewalls 18 were covering the upper surface and the first and second side surfaces A and B of the silicon island 12. These oxide layers covering the silicon island 12 are now removed, as shown in FIG. 14D, thereby exposing the upper surface and the first and second side surfaces A and B of the silicon island 12. The recess 38 may be laterally expanded during the wet etching process.

Over the exposed upper surface and the first and second side surfaces A and B, a dielectric material is deposited or an oxidation is performed to form a gate dielectric layer, as shown in FIGS. 15A–15D. In this embodiment, the gate dielectric layer is formed by depositing a dielectric layer 40 over the entire structure, as shown in FIGS. 15A–15D. Particularly, FIG. 15D depicts the gate dielectric layer 40 is formed on the exposed upper surface and the first and second side surfaces of the silicon island 12. However, the gate dielectric layer can be formed by conventional oxidation techniques.

According to the present invention, the dummy gate oxide layer 14 is first formed and removed, and the actual gate dielectric layer 40 is formed in the later stage of the transistor fabrication processes. This enables the use of high dielectric constant (high k) material (e.g., tantalum pentaoxide ($Ta_2O_5$), barium strontium titanate ($Ba_xSr_{1-x}TiO_3$), yttrium silicate, etc.) for the gate dielectric material. Generally, the high dielectric constant material tend to be susceptible to decomposition or breakdown under high temperature processing. Since all high temperature processes have already been performed prior to the gate dielectric deposition, even the materials susceptible to high temperature may be used at this point without any adverse effects to device performance. The high k gate dielectric layer 40 enables further down-scaling of the device dimension, in conjunction with a wrapped-gate structure which will be described hereafter.

Subsequently, the recess 36 and recesses 38 are filled to form a gate electrode 42, preferably by conductive material deposition and planarization, as depicted in FIGS. 16A–16D. As particularly shown in FIGS. 16D, a wrapped-gate structure is formed, in which the gate electrode 42 is arranged on the upper surface and the first and second side surfaces A and B of the silicon island 12.

The materials for the gate electrode can be selected from various materials, such as amorphous silicon, amorphous silicon-germanium, polysilicon, metal or a metal alloy. After depositing the conductive material, planarization is performed to shape the gate electrode 42, as shown in FIGS. 16A–16D. If amorphous silicon or amorphous silicon-germanium is used for the gate electrode material, additional masking and ion implantation processes may be required to increase the conductivity of the gate electrode 42.

Upon completing the gate electrode formation, source/drain contacts are formed to provide conductive paths to the source and drain regions 28. As shown in FIGS. 17A–17D, the interlayer dielectric layer 34 is patterned to expose the source/drain regions 28, by conventional masking and patterning techniques. As particularly shown in FIG. 17C, the recesses 44 extends from the dielectric layer 40 to the source/drain regions 28 via the interlayer dielectric layer 34 and the nitride liner 32. Subsequently, as shown in FIGS. 18A–18D, a conductive layer is deposited to fill the recesses 44 and planarization is performed, thereby forming the source/drain contacts 46.

By forming a gate electrode to overlie the channel region from the three surfaces, the present invention substantially improves the gate control on the substrate potential, which results in a steep sub-threshold slope and low sensitivity to the "body-to-source" voltage. Also, as compared to conventional planar MOSFET devices, the effective gate width is substantially enhanced by the portions of the gate electrode 42 extended to cover the side surfaces A and B of the silicon island 12 (i.e., gate extensions).

Fabrication of CMOS circuits, which contain both NMOS and PMOS circuits, may require a slight modification of precessing schemes. To those skilled in the art, this would be a variation of the processing schemes described above. During the dummy gate patterning step as described in FIGS. 7A–7D, the area containing the first conductivity type of field effect transistor (FET), either N type or P type, is patterned using the first mask while the other area, containing the second conductivity type of FET, is left intact under the first gate mask. Processing continues until the step corresponding to FIG. 12A–12D is completed. At this point, using a second gate mask, the dummy gate lines for the second conductivity type of FET is patterned while the previously patterned area is left intact under the second mask. In the previously patterned area with the first conductivity type FET, even after the second mask is removed, the interlayer dielectric 34 and the combined stack of polysilicon 24 and dummy gate oxide 14 protects the silicon island below from further doping during the doping of the second conductivity type FET. A similar processing sequence as the first one between 7A–7D and 12A–12D is repeated, ending with a second interlayer dielectric deposition and planarization. Thus, two different conductivity types of FET may be fabricated. Fabrication of FET with different doping levels is a straightforward extension, where multiple gate masks and multiple doping steps are repeated.

Accordingly, the present invention provides a wrapped-gate structure, in which the gate electrode 42 covers the substrate 12 (e.g., silicon island) from the upper surface and two side surfaces with the gate dielectric layer 40 therebetween. This enables a better and quicker potential control within the channel area, which yields steep sub-threshold slope slope and low sensitivity to the "body-to-source" voltage.

Also, with a wrapped-gate structure, the effective gate length is enhanced as compared to conventional MOSFET device with the same gate length. This increase in the gate width may typically result in multiple increase in turn-on current. Further, since the present invention enables to reduce the space occupied by a single MOSFET transistor (i.e., the width of the silicon island), fully depleted operations will be achieved even at lower doping concentration of the substrate. Accordingly, an improvement in on-current, sub-threshold slope, body bias sensitivity and short channel effects, and reduced kink effects will be obtained. Further, in terms of the fabrication point of view, since the gate dielectric layer is formed in the later stage of the fabrication steps, high k materials can be used for the gate dielectric layer for further down-scaling of the device dimension.

Those skilled in the art may readily recognize that the implementation of this invention does not necessarily require SOI substrate and that conventional non-SOI substrate may be used to implement this invention. Also, as a variation of this type of device, an FET with emphasis on current gain may be fabricated in which the depth of the wings of the gate is relatively deep, i.e., has a very high aspect ratio, to maximize the current gain while the channel at the top is negligible. Thus, while the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A semiconductor device comprising:
    a substrate having an upper surface and first and second side surfaces substantially parallel to each other;
    a channel region arranged between said first and second side surfaces within said substrate;
    source/drain regions formed in said substrate and separated by said channel region;
    a gate electrode arranged on said upper surface and said first and second side surfaces of said substrate with a gate dielectric layer therebetween; and
    said substrate further having third and fourth side surfaces substantially parallel to each other and substantially perpendicular to said first and second side surfaces,
    wherein said source/drain regions are formed in first and second portions of said upper surface, respectively, said first and second portions of said upper surface abutting said third and fourth side surfaces of said substrate, respectively, and separated by said channel region and wherein said source/drain regions extend from said first and second portions of said upper surface to said third and fourth side surfaces of said substrate, respectively.

2. The semiconductor device of claim 1, wherein said channel region extends from said first side surface to said second side surface.

3. The semiconductor device of claim 1, wherein
    said source region further extends to first portions of said first and second side surfaces adjoining said third surface and the first portion of said upper surface of said substrate, and
    said drain region further extends to second portions of said first and second side surfaces adjoining said fourth surface and the second portion of said upper surface of said substrate.

4. The semiconductor device of claim 3, further comprising
    source/drain extensions formed in said upper surface and said first and second side surfaces of said substrate between said channel region and said source and drains regions, respectively.

5. The semiconductor device of claim 4, further comprising:
    an interlayer dielectric layer covering said substrate; and
    source/drain contacts extending through said interlayer dielectric layer to said source/drain regions.

6. The semiconductor device of claim 1, wherein said substrate is a part of a silicon-on-insulator (SOI) substrate.

7. The semiconductor device of claim 6, wherein said substrate is a silicon island arranged on an insulation layer of said SOI substrate.

8. The semiconductor device of claim 1, wherein said gate dielectric layer is a high k material.

9. A semiconductor device comprising:
    a channel region positioned between source and drain regions formed in a semiconductor substrate;
    a gate electrode positioned over said channel region;
    gate extensions extending from said gate electrode to first and second side surfaces of said semiconductor substrate, said first and second side surfaces being positioned at opposite ends of said channel region; and
    said semiconductor substrate having third and fourth side surfaces, wherein said source/drain regions are formed in first and second portions of said upper surface adjoining said third and fourth side surfaces, respectively and wherein said source/drain regions extends from said first and second portions of said upper surface to said third and fourth side surfaces, respectively.

10. The semiconductor device of claim 9, further comprising a gate dielectric layer between said channel region and said gate electrode/gate extensions.

11. A method for manufacturing a semiconductor device, comprising the steps of:
   forming a substrate having an upper surface and first and second side surfaces;
   forming source and drain regions in said substrate with a channel region therebetween,
   forming a gate oxide on said upper surface and said first and second side surfaces of said substrate to cover said channel region;
   forming a gate electrode on said gate oxide such that said gate electrode overlies said channel region from said upper surface and said first and second side surfaces of said substrate;
   forming a first mask layer on said upper surface of said substrate;
   etching said substrate to form said first and second side surfaces and third and fourth side surfaces; and
   said step of forming said source and drain regions comprising the steps of:
      forming a second mask layer on said upper surface of said substrate to selectively expose said third and fourth side surfaces and portions of said upper surface and said first and second side surfaces adjoining said third and fourth side surfaces of the substrate; and
      forming said source and drain regions in said third and fourth side surfaces and said exposed portions of said upper surface and said first and second side surfaces of said substrate by gas phase doping, plasma doping or angled ion implantation.

12. The method of claim 15, comprising:
   forming a sacrificial layer to selectively expose said third and fourth side surfaces and said portions of said upper surface and said first and second side surfaces adjoining said third and fourth side surfaces of the substrate;
   forming said second mask layer on said sacrificial layer;
   performing gas phase doping or plasma doping to form said source and drain regions;
   selectively etching said sacrificial layer to remove edge portions of said sacrificial layer facing said third and fourth side surfaces of said substrate;
   performing gas phase doping, plasma doping or angled ion implantation of second impurity atoms via said removed edge portions of said sacrificial layer to form source/drain extensions in the substrate between said channel region and said source and drain regions.

13. The method of claim 12, wherein said step of forming said gate oxide comprising the steps of:
   depositing an interlayer dielectric over the substrate and said second mask layer;
   planarizing said interlayer dielectric to expose a top surface of said second mask layer;
   selectively removing said second mask layer and said sacrificial layer to form a via hole exposing portions of said upper surface and said first and second side surfaces of said substrate previously masked by said second mask layer; and
   depositing an oxide layer on said upper surface and said first and second side surfaces of said substrate exposed by said via hole to form said gate oxide.

14. The method of claim 13, wherein said step of forming said gate electrode comprising the steps of:
   filling said via hole with a conductive material; and
   planarizing an upper surface of said conductive material to form said gate electrode overlying said channel region from said upper surface and said first and second side surfaces of said substrate with said gate oxide therebetween.

15. The method of claim 14, further comprising the steps of:
   forming trenches extending from an upper surface of said interlayer dielectric to portions of said upper surface of said substrate occupied by said source and drain regions, respectively; and
   filling said trenches with a conductive material to form source/drain contacts.

16. The method of claim 12, wherein the step of forming said substrate further comprising:
   forming an insulating layer on a body substrate;
   forming a surface substrate on said insulating layer, said surface substrate having said upper surface,
   forming said sacrificial layer on said upper surface of said surface substrate;
   forming a pad layer on said sacrificial layer;
   forming said first mask layer on said pad layer;
   performing said etching step to remove portions of said pad layer, sacrificial layer and surface substrate unmasked by said first mask layer, thereby forming said surface substrate having said first, second, third and fourth side surfaces, and exposing said insulating layer.

17. The method of claim 16, further comprising the steps of:
   forming an protection layer on said first, second, third and fourth side surfaces of said substrate and side surfaces of said sacrificial layer;
   depositing an amorphous silicon on side surfaces of said nitride layer and said oxide protection layer;
   forming a filling oxide layer over said exposed insulating layer and said pad layer;
   planarizing to remove said pad layer to expose an upper surface of said protection layer.

18. The method of claim 17, wherein said step of forming a second mask layer comprising:
   depositing a masking material to cover said protection layer, amorphous silicon and filling layer; and
   etching said masking material to form said second mask layer.

19. The method of claim 18, further comprising the steps of
   removing said amorphous silicon except for a portion masked by said polysilicon layer; and
   etching said protection layer and sacrificial layer except for portions masked by said second mask layer to selectively expose said third and fourth side surfaces and said portions of said upper surface and said first and second side surfaces adjoining said third and fourth side surfaces of the substrate.

20. A method for manufacturing a wrapped-gate transistor comprising the steps of:

forming at least two trenches in an upper silicon substrate of an silicon-on-insulation (SOI) substrate, wherein said at least two trenches are formed at opposite ends of said upper silicon substrate and define first said second side surfaces of said upper silicon substrate;

forming third and fourth side surfaces in said upper silicon substrate, said third and fourth side surfaces adjoining said first and second side surfaces;

forming source/drain regions in an upper surface of said upper silicon substrate and in said third and fourth side surfaces and a channel region between said source/drain regions within said upper silicon substrate;

positioning a gate electrode over said channel region, said gate electrode extending onto both said first and second side surfaces of said upper silicon substrate.

* * * * *